(12) United States Patent
Fukuhara

(10) Patent No.: US 7,691,542 B2
(45) Date of Patent: Apr. 6, 2010

(54) EXPOSURE SYSTEM, TEST MASK FOR FLARE TESTING, METHOD FOR EVALUATING LITHOGRAPHY PROCESS, METHOD FOR EVALUATING EXPOSURE TOOLS, METHOD FOR GENERATING CORRECTED MASK PATTERN, AND METHOD FOR MANUFACTURING SEMICONDUCTOR DEVICE

(75) Inventor: Kazuya Fukuhara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1070 days.

(21) Appl. No.: 11/034,958

(22) Filed: Jan. 14, 2005

(65) Prior Publication Data

US 2005/0170264 A1 Aug. 4, 2005

(30) Foreign Application Priority Data

Jan. 16, 2004 (JP) .......................... P2004-009816

(51) Int. Cl.
*G03F 9/00* (2006.01)

(52) U.S. Cl. .............................. 430/5; 716/19; 716/21; 716/4; 430/311

(58) Field of Classification Search ..................... 716/4, 716/19; 430/5; 702/84
See application file for complete search history.

(56) References Cited

U.S. PATENT DOCUMENTS 5,586,059 A * 12/1996 Oshelski et al. ............... 702/84
5,858,578 A * 1/1999 Ukeda et al. ................... 430/5
6,403,291 B1 * 6/2002 Kawashima et al. .......... 430/394
6,954,911 B2 * 10/2005 Pierrat ............................ 716/4
7,246,342 B2 * 7/2007 Hsu et al. ...................... 716/19
2003/0068565 A1 * 4/2003 Ki et al. ......................... 430/5
2004/0023130 A1 * 2/2004 Yao et al. ....................... 430/5

FOREIGN PATENT DOCUMENTS

JP          2000-235945          8/2000

(Continued)

OTHER PUBLICATIONS

First Notice of Grounds for Rejection issued by the Chinese Patent Office on Nov. 17, 2006, for Chinese Patent Application No. 200510009055, with Japanese and English-language translations thereof.
Notice of Reasons for Rejection issued by the Japanese Patent Office on Dec. 19, 2006, for Japanese Patent Application No. 2004-009816, and English-language translation thereof.
Eishi Shiobara et al., "Dependence of Resist Profile on Exposed Area Ratio", Advances in Resist Technology and Processing XVIII, SPIE vol. 4345, pp. 628-636, (2001).

(Continued)

*Primary Examiner*—Mark F Huff
*Assistant Examiner*—Rashid Alam
(74) *Attorney, Agent, or Firm*—Finnegan, Henderson, Farabow, Garrett & Dunner, L.L.P.

(57) ABSTRACT

An exposure system has an exposure tool configured to project images of a grating pattern and a test pattern having an opening onto an identical exposure field on a wafer, a measuring module configured to measure critical dimension variations of the projected grating pattern by setting a position of the projected test pattern as a measurement standard, and a pattern density influence estimator configured to estimate an influence of a pattern density of a mask to be mounted in the exposure tool upon the critical dimension variations.

15 Claims, 17 Drawing Sheets

FOREIGN PATENT DOCUMENTS

| | | |
|---|---|---|
| JP | 2001-222097 | 8/2001 |
| JP | 2001-272766 | 10/2001 |
| JP | 2001-296646 | 10/2001 |
| JP | 2002-318448 | 10/2002 |
| JP | 2003-100624 | 4/2003 |
| JP | 2003-318095 | 11/2003 |
| WO | WO 2005/008754 A1 | 1/2005 |

OTHER PUBLICATIONS

Joseph P. Kirk, "Scattered light in photolithographic lenses", Proc. SPIE vol. 2197, pp. 566-572, (1994).

* cited by examiner

EXPOSURE SYSTEM, TEST MASK FOR FLARE TESTING, METHOD FOR EVALUATING LITHOGRAPHY PROCESS, METHOD FOR EVALUATING EXPOSURE TOOLS, METHOD FOR GENERATING CORRECTED MASK PATTERN, AND METHOD FOR MANUFACTURING SEMICONDUCTOR DEVICE

CROSS-REFERENCE TO RELATED APPLICATIONS AND INCORPORATION BY REFERENCE

This application is based upon and claims the benefit of priority from prior Japanese Patent Application P2004-9816 filed on Jan. 16, 2004; the entire contents of which are incorporated by reference herein.

BACKGROUND OF THE INVENTION

1. Field of the Invention

The present invention relates to photolithography techniques and in particular to an exposure system, a test mask for flare testing, a method for evaluating lithography process, a method for evaluating exposure tools, a method for generating a corrected mask pattern, and a method for manufacturing a semiconductor device.

2. Description of the Related Art

As semiconductor devices continue to shrink in size over time, so do the individual circuit patterns. Accordingly, reproducing a designed circuit pattern on a wafer by exposing a mask has recently become difficult. Therefore, a method for controlling a line width of the projected pattern precisely is demanded. The optical proximity effect (OPE) is one of primary factors causing line width variations. The OPE depend on a pattern density or a periodicity of a region surrounding a feature of interest on a mask within a radius of some micrometers.

Further, the line width variations also depend on the local pattern density of the region surrounding the feature of interest within a radius of 10 to 1,000 micrometers. A mid range flare generated in an exposure tool, an acid diffusion into the air and accumulation on the resist surface during the post exposure bake (PEB) process and an unevenness of a concentration of the developer during the developing process are representative primary factors that depend on the local pattern density and cause unwanted line width variations.

In Japanese Patent Laid-Open Publication No. 2003-100624, a method for evaluating the flare intensity that is one of the primary factors of the line width variations depending on the pattern density of the mask is proposed. According to the method, a mask having a plurality of congruent rectangular patterns formed in a light shield layer and a transparent region is prepared. By measuring projected images of the rectangular patterns, the flare intensity is estimated.

However, the mask pattern is also manufactured by the lithography process such as the electron beam (EB) lithography, a resist development, and an etching process. Therefore, a feature of interest on the mask substrate may also vary dependent on the pattern density of a region surrounding the feature. Even though each size of the rectangular patterns formed in the shield layer and the transparent region is designed to be same, manufactured rectangular patterns may contain the manufacturing error in the size. Since measured sizes of the projected images of the rectangular patterns are affected by the manufacturing error, the measured size may not precisely reflect the primary factors causing the line width variations such as mid range flare.

SUMMARY OF THE INVENTION

An aspect of present invention inheres in an exposure system according to an embodiment of the present invention. The exposure system has an exposure tool configured to project images of a grating pattern and a test pattern having an opening onto an identical exposure field on a wafer, a measuring module configured to measure critical dimension variations of the projected grating pattern by setting a position of the projected test pattern as a measurement standard, and a pattern density influence estimator configured to estimate an influence of a pattern density of a mask to be mounted in the exposure tool upon the critical dimension variations.

Another aspect of the present invention inheres in a test mask for flare testing according to an embodiment of the present invention. The test mask for flare testing has a mask substrate, a grating pattern disposed on a portion of the mask substrate and having a uniform pattern density, and a test pattern disposed on another portion of the mask substrate and having a plurality of openings.

Yet another aspect of the present invention inheres in a method for evaluating lithography process according to an embodiment of the present invention. The method for evaluating lithography process has coating a resist on a wafer, projecting images of a grating pattern and a test pattern having an opening onto an identical exposure field on the resist, measuring critical dimension variations of the projected grating pattern by setting a position of the projected test pattern as a measurement standard, and estimating an influence of a pattern density of a mask upon the critical dimension variations.

Yet another aspect of the present invention inheres in a method for evaluating exposure tools according to an embodiment of the present invention. The method for evaluating exposure tools has coating resists on a plurality of wafers and inserting the wafers into different exposure tools respectively, projecting images of an grating pattern and a test pattern having an opening onto an identical exposure field on each of the resists by the exposure tools respectively, measuring critical dimension variations of the projected grating pattern on each of the wafers respectively by setting a position of the projected test pattern as a measurement standard, and ranking the exposure tools hierarchically based on the critical dimension variations.

Yet another aspect of the present invention inheres in a method for generating a corrected mask pattern according to an embodiment of the present invention. The method for generating the corrected mask pattern has calculating critical dimension variations in a projected image of a mask pattern based on a model function representing a distribution of primary factors causing the critical dimension variations and a design data of the mask pattern, determining whether the critical dimension variations are within a permissible value, calculating a correcting bias added to the design data to reduce the critical dimension variations, and correcting the design data by using the correcting bias.

Yet another aspect of the present invention inheres in a method for manufacturing a semiconductor device according to an embodiment of the present invention. The method for manufacturing the semiconductor device has projecting images of a grating pattern and a test pattern having an opening onto an identical exposure field on each of a plurality of wafers under different lithography conditions respectively, measuring critical dimension variations of the projected grating pattern formed under each of the lithography conditions respectively by setting a position of the projected test pattern as a measurement standard, determining a best lithography condition reducing the critical dimension variations from the lithography conditions, and projecting a mask pattern onto a wafer to be manufactured under the best lithography condition to produce a device pattern on the wafer.

DETAILED DESCRIPTION OF THE INVENTION

Figure 1:
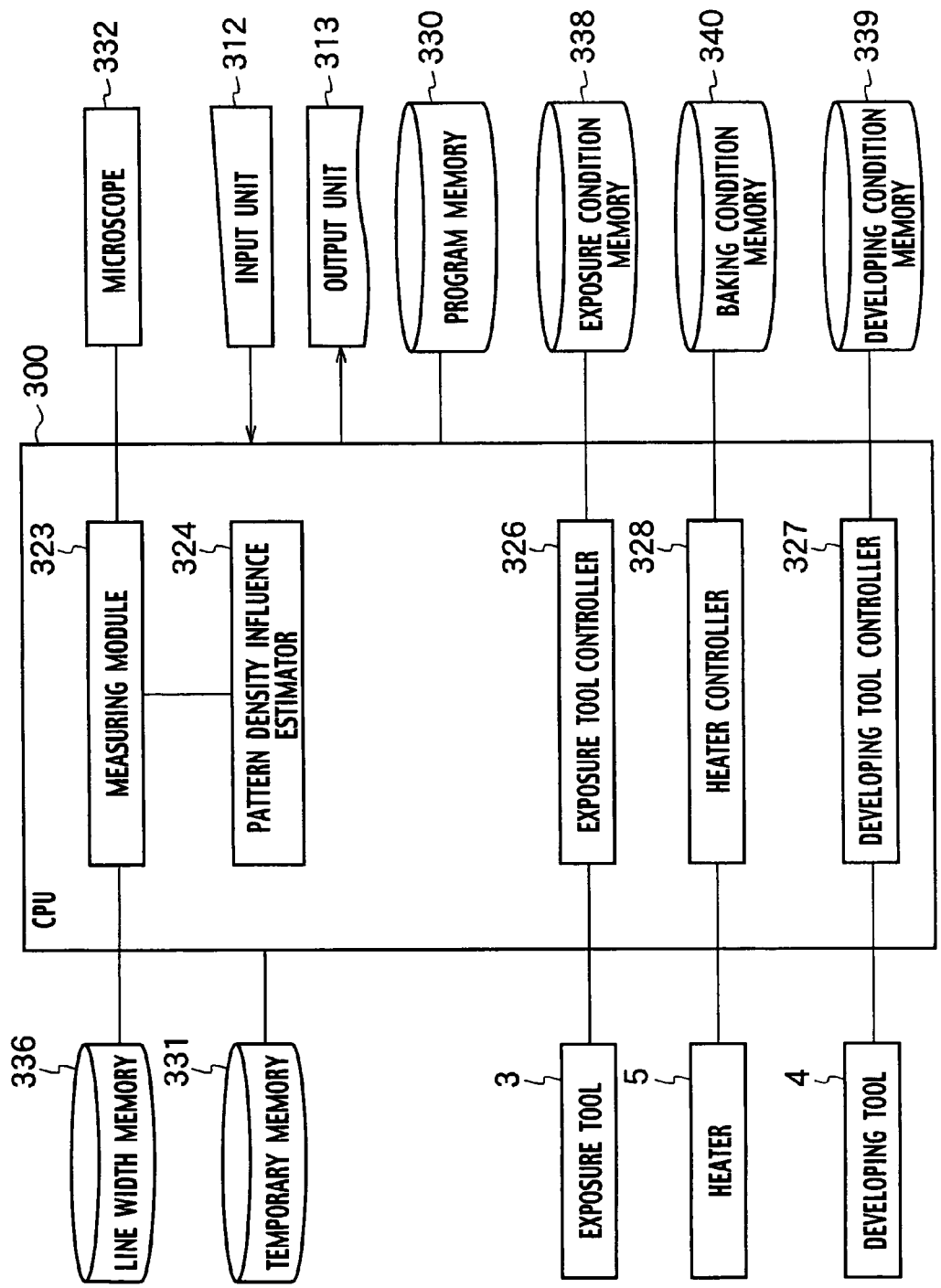
FIG. 1 is a diagram of an exposure system in accordance with a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

With reference to FIG. 1, an exposure system in accordance with a first embodiment has an exposure tool 3 configured to project images of a grating pattern and a test pattern having an opening onto an identical exposure field on a wafer, and a central processing unit (CPU) 300. The CPU 300 has a measuring module 323 configured to measure critical dimension (CD) variations of the projected grating pattern by setting a position of the projected test pattern as a measurement standard, and a pattern density influence estimator 324 configured to estimate an influence of a pattern density of a mask to be mounted in the exposure tool 3 upon the CD variations. Here, the "CD" is the distance between line-space boundaries at a given cross section of a feature such as "line width".

Further, the exposure system has a heater 5, a developing tool 4, a microscope 332, a line width memory 336, an exposure condition memory 338, a baking condition memory 340, and a developing condition memory 339. Also, the CPU 300 further has an exposure tool controller 326, a heater controller 328, and a developing tool controller 327.

Figure 2:
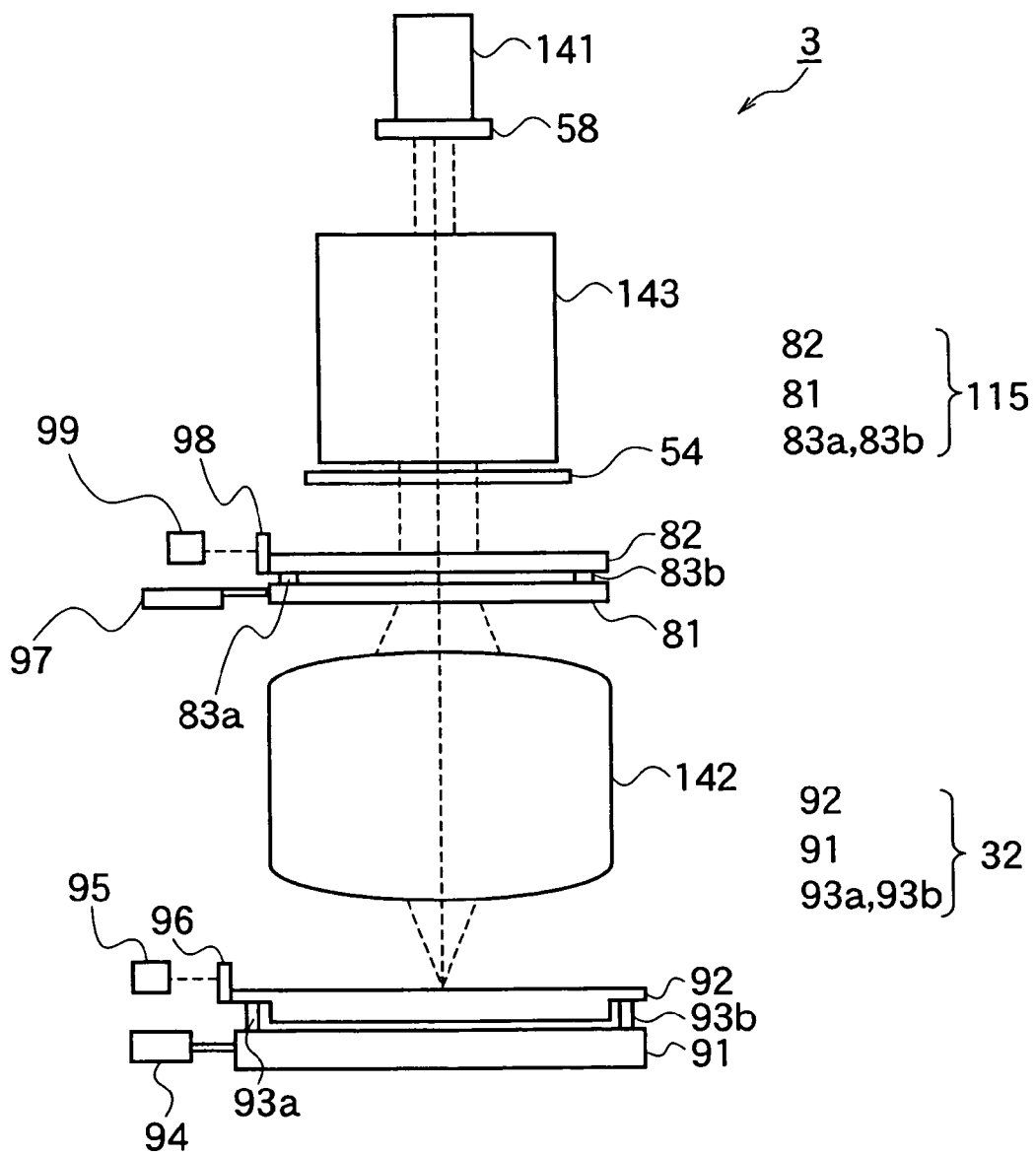
FIG. 2 illustrates an exposure tool in accordance with the first embodiment of the present invention.

With reference next to FIG. 2, the exposure tool 3 has a light source 141 emitting a light such as ArF (argon fluoride) laser, an aperture diaphragm holder 58 disposed under the light source 141, an illuminator 143 condensing the light emitted from the light source 141, a slit holder 54 disposed under the illuminator 143, a reticle stage 115 disposed beneath the slit holder 54, a projection optical system 142 disposed beneath the reticle stage 115, and a wafer stage 32 disposed beneath the projection optical system 142.

The reticle stage 115 has a reticle XY stage 81, shafts 83*a*, 83*b* provided on the reticle XY stage 81, and a reticle tilting stage 82 attached to the reticle XY stage 81 through the shafts 83*a*, 83*b*. The reticle stage 115 is attached to a reticle stage aligner 97. The reticle stage aligner 97 aligns the position of the reticle XY stage 81. Each of the shafts 83*a*, 83*b* extends from the reticle XY stage 81. Therefore, the position of the reticle tilting stage 82 is determined by the reticle XY stage 81. And the tilt angle of the reticle tilting stage 82 is determined by the shafts 83*a*, 83*b*. Further, a reticle stage mirror 98 is attached to the edge of the reticle tilting stage 82. The position of the reticle tilting stage 82 is monitored by an interferometer 99 disposed opposite the reticle stage mirror 98.

The wafer stage 32 is configured to mount a silicon wafer coated with an anti-reflection and a resist. The wafer stage 32 has a wafer XY stage 91, shafts 93*a*, 93*b* provided on the wafer XY stage 91, and a wafer tilting stage 92 attached to the wafer XY stage 91 through the shafts 93a, 93b. The wafer stage 32 is attached to a wafer stage aligner 94. The wafer stage aligner 94 aligns the position of the wafer XY stage 91. Each of the shafts 93a, 93b extends from the wafer XY stage 91. Therefore, the position of the wafer tilting stage 92 is determined by the wafer XY stage 91. And the tilt angle of the wafer tilting stage 92 is determined by the shafts 93a, 93b. Further, a wafer stage mirror 96 is attached to the edge of the wafer tilting stage 92. The position of the wafer tilting stage 92 is monitored by an interferometer 95 disposed opposite the wafer stage mirror 96.

Figure 3:
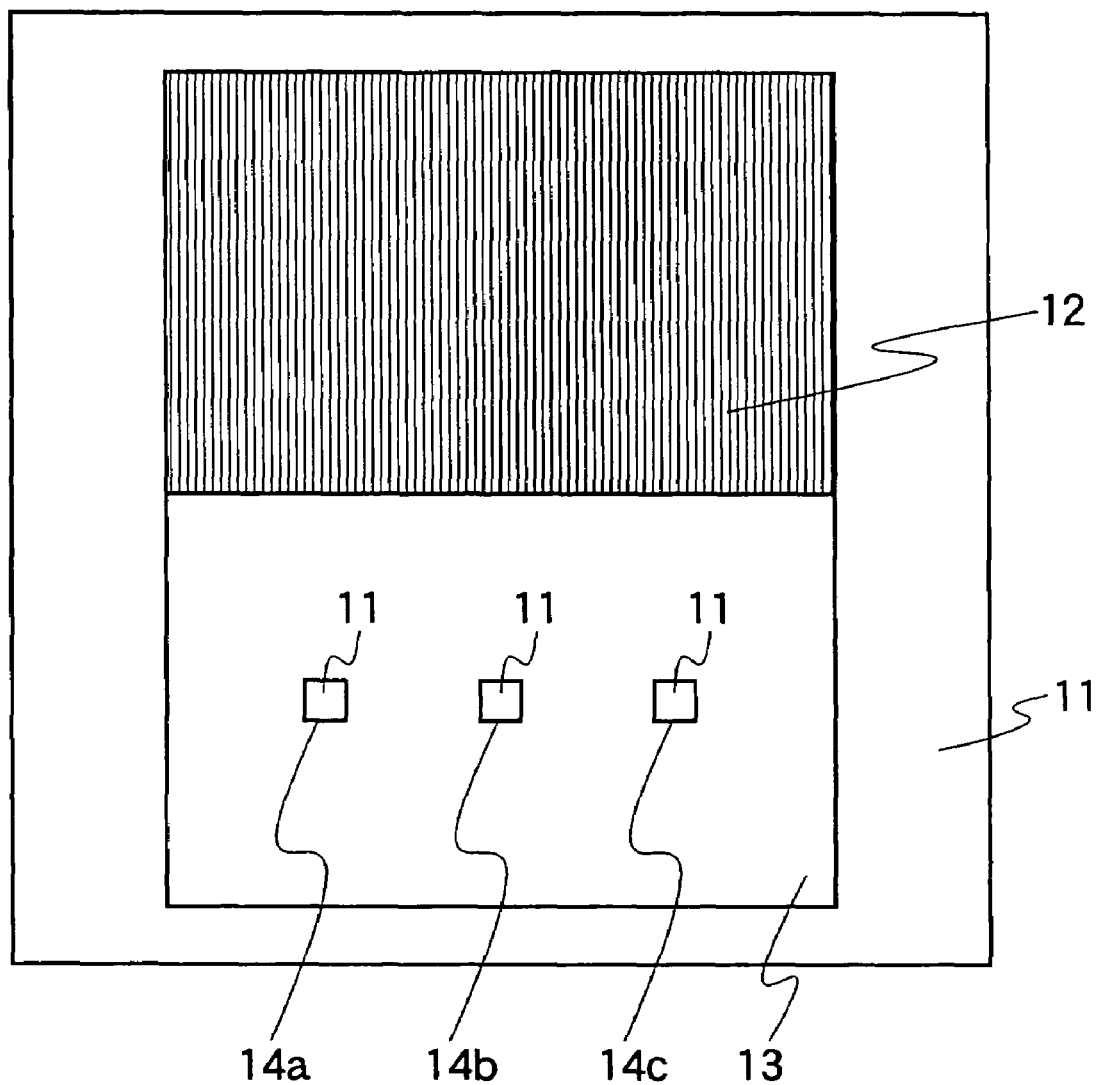
FIG. 3 is a plan view of a test mask for flare testing in accordance with the first embodiment of the present invention.

On the reticle stage 115, a test mask for flare testing shown in FIG. 3 may be mounted. The test mask for the flare testing in accordance with the first embodiment has a transparent mask substrate 11, a grating pattern 12 disposed on a portion of the mask substrate 11 and having a uniform pattern density, and a test pattern 13 disposed on another portion of the mask substrate 11 and having a plurality of openings 14a, 14b, 14c. A silica glass can be used for the mask substrate 11. The area of the grating pattern 12 is equal to the area of the test pattern 13. The grating pattern 12 has a plurality of parallel attenuated phase shifters ruled on the mask substrate 11. The attenuated phase shifters are spaced in a predefined relationship so that a projected image of the grating pattern 12 would be a line and space pattern of which center-to-center spacing is 0.2 μm.

The test pattern 13 is a light shielding film deposited on the mask substrate 11. Each shape of the openings 14a, 14b, 14c is congruent. For example, each shape of the openings 14a-14c is a square. And the length of each side of the openings 14a-14c is 2,000 μm. The light penetrates the portions of the mask substrate 11 through the openings 14a-14c. The openings 14a-14c are spaced apart a predetermined distance in parallel. For example, the openings 14a-14c are spaced apart at least 20,000 μm that is ten times as long as the side of the openings 14a-14c. Though three openings 14a-14c are delineated in the test pattern 13 in FIG. 3, it should be noted that the number of the openings is not limited to three and more openings may be delineated in the test pattern 13.

With reference again to FIG. 1, the exposure condition memory 338 stores a plurality of exposure conditions, such as a numerical aperture (NA) of the projection optical system 142 shown in FIG. 2, a coherence factor σ, and an aperture type for annular or quadrupolar illumination. The exposure tool controller 326 shown in FIG. 1 controls the exposure conditions of the exposure tool 3. For example, the exposure tool controller 326 instructs the reticle stage aligner 97 shown in FIG. 2 and the wafer stage aligner 94 to shift and tilt the reticle stage 115 and the wafer stage 32. The exposure tool controller 326 also monitors the orientation, the shift direction, and the shift speed of the reticle stage 115 and the wafer stage 32 by using the interferometer 99 and the interferometer 95.

Also, the exposure tool controller 326 instructs the exposure tool 3 to project the image of grating pattern 12 shown in FIG. 3 onto the exposure filed of the resist coated on a test wafer mounted on the wafer stage 32 shown in FIG. 2. Further, the exposure tool controller 326 shown in FIG. 1 instructs the reticle stage aligner 97 shown in FIG. 2 to shift the reticle stage 115 and instructs the exposure tool 3 to project the image of the test pattern 13 shown in FIG. 3 onto the identical exposure filed on the test wafer. In addition, the exposure tool controller 326 shown in FIG. 1 instructs the exposure tool 3 to project the image of the grating pattern 12 shown in FIG. 3 only onto a resist coated on a reference wafer mounted on the wafer stage 32 shown in FIG. 2. In this case, the exposure tool controller 326 shown in FIG. 1 employs the same exposure conditions as in the case of the test wafer.

With reference again to FIG. 1, the heater 5, such as an oven, is configured to bake the test wafer and the reference wafer in order to perform a PEB process for the resist. The heat controller 328 adjusts baking conditions in the heater 5. The baking conditions include a baking time and an internal temperature. The baking condition memory 340 stores the baking conditions of the heater 5.

The developing tool 4 is configured to develop the resist coated on the test wafer and the reference wafer. The developing tool controller 327 adjusts developing conditions of the developing tool 4. The developing conditions include the concentration of a developer, a developer temperature, and a developing time. The developing condition memory 339 stores the developing conditions of the developing tool 4.

Figure 4:
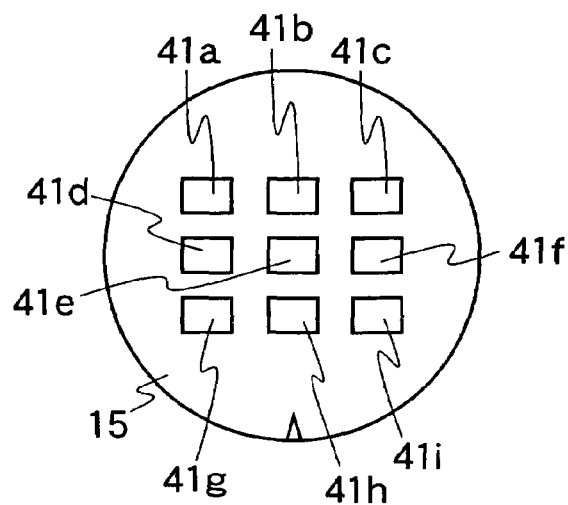
FIG. 4 is a plan view of a test wafer in accordance with the first embodiment of the present invention.
Figure 5:
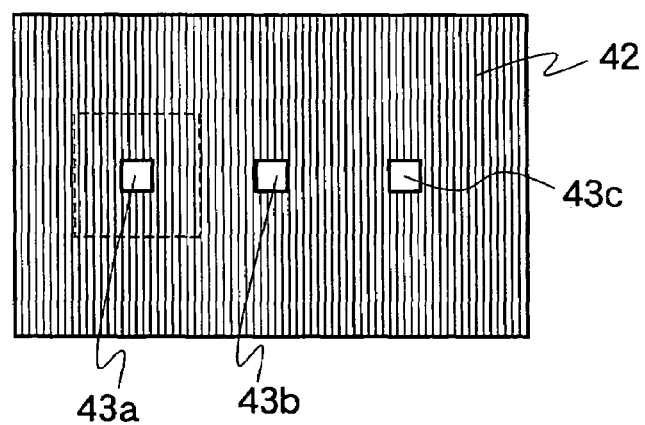
FIG. 5 is a first enlarged plan view of the test wafer in accordance with the first embodiment of the present invention.

FIG. 4 depicts a plan view of the resist 15 coated on the test wafer. Exposed with the test mask for the flare testing shown in FIG. 3 and developed with the developing tool 4 shown in FIG. 1, a plurality of resist patterns 41a, 41b, 41c, 41d, 41e, 41f, 41g, 41g, 41i shown in FIG. 4 are formed in the resist 15. FIG. 5 depicts an enlarged plane view of the resist pattern 41a on the test wafer shown in FIG. 4. The resist pattern 41a has a plurality of projected openings 43a, 43b, 43c surrounded by a projected grating pattern 42. The projected openings 43a-43b and the projected grating pattern 42 are formed by projecting the openings 14a, 14b, 14c and the grating pattern 12 shown in FIG. 3 onto the resist 15 coated on the test wafer. With a 1× reduction ratio, each square side length of the projected openings 43a, 43b, 43c is 2,000 μm. Also, the projected openings 43a, 43b, 43c are spaced apart at least 20,000 μm.

Figure 6:
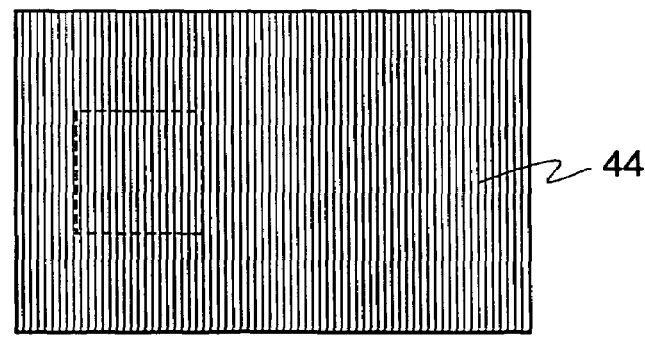
FIG. 6 is a first enlarged plan view of a reference wafer in accordance with the first embodiment of the present invention.

A plan view of the exposed and developed resist on the reference wafer is similar to FIG. 4. FIG. 6 depicts an enlarged plane view of the projected grating pattern 44 on the reference wafer With reference again to FIG. 1, an atomic force microscope (AFM) and a scanning electron microscope (SEM) can be used for the microscope 332. The microscope 332 is configured to obtain each test observation image of the resist patterns 41a, 41b, 41c, 41d, 41e, 41f, 41g, 41g, 41i on the test wafer shown in FIG. 4. Also, the microscope 332 shown in FIG. 1 is configured to obtain a reference observation image of the projected grating pattern 44 shown in FIG. 6 on the reference wafer.

Figure 7:
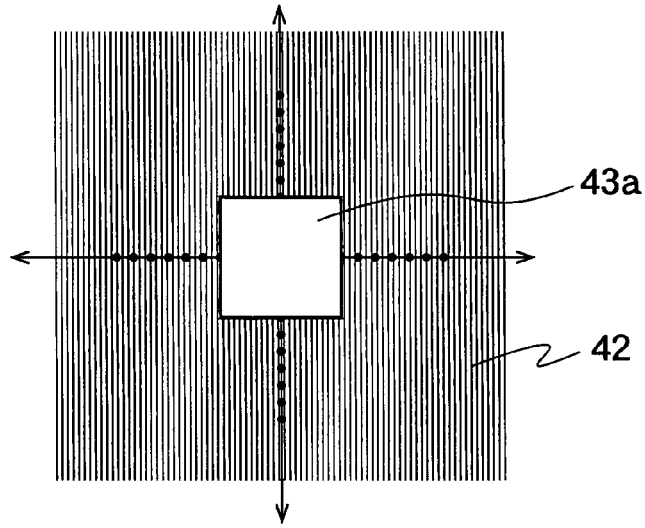
FIG. 7 is a second enlarged plan view of the test wafer in accordance with the first embodiment of the present invention.

The measuring module 323 shown in FIG. 1 is configured to analyze the test observation image and the reference observation image obtained by the microscope 332. FIG. 7 depicts an enlarged plane view of an area surrounded by a broken line in FIG. 5. With reference to FIG. 7, the test coordinate system is set on the test observation image by the measuring module 323 shown in FIG. 1. In this case, the center of the projected openings 43a shown in FIG. 7 is defined as the origin of the test coordinate system. Further, the measuring module 323 shown in FIG. 1 arranges a plurality of measuring points on axes of the test coordinate system from four sides of the projected openings 43a as shown in FIG. 7. For example, the number of the measuring points in a line is 30 and the measuring points are spaced at 40 μm.

The measuring module 323 shown in FIG. 1 measures a test CD at each of the measuring points in the projected grating pattern 42 shown in FIG. 7. Similarly, the measuring module 323 shown in FIG. 1 measures test CDs in the projected grating pattern 42 around the projected openings 43b, 43c shown in FIG. 5.

Figure 8:
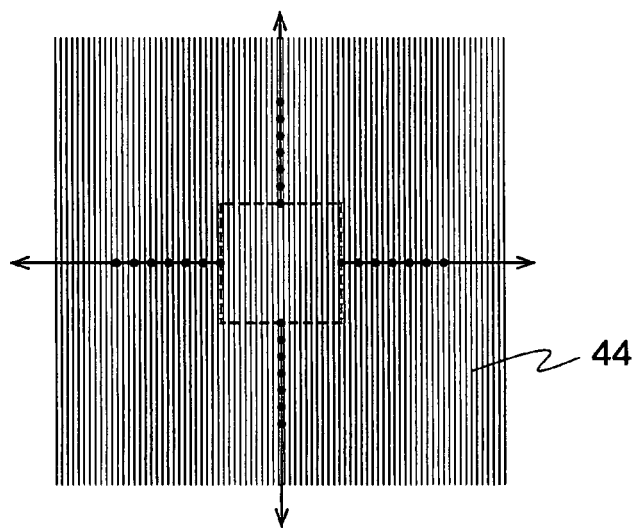
FIG. 8 is a second enlarged plan view of the reference wafer in accordance with the first embodiment of the present invention.

FIG. 8 depicts an enlarged plane view of an area surrounded by a broken line in FIG. 6. With reference to FIG. 8, the reference coordinate system is set on the reference observation image by the measuring module 323 shown in FIG. 1. In this case, the measuring module 323 defines the origin of the reference coordinate system in the relatively same position where the origin of the test coordinate system is defined. Further, the measuring module 323 measures a reference CD at each of the relatively same measuring points in the projected grating pattern 44 shown in FIG. 8 as in the case of the test observation image.

Figure 9:
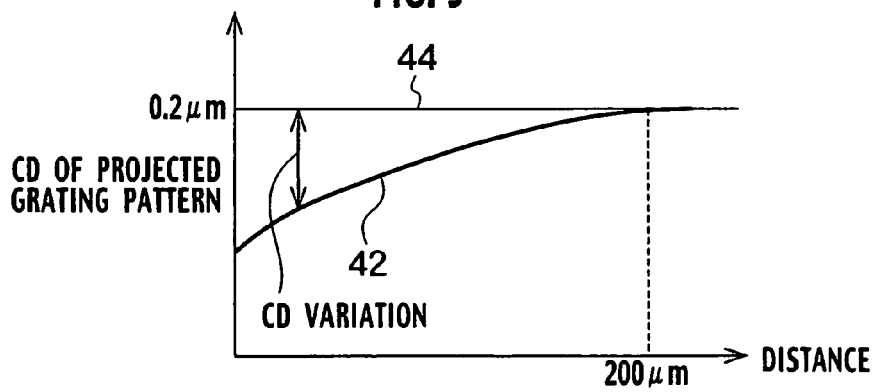
FIG. 9 is a sample graph of CD of projected grating pattern in accordance with the first embodiment of the present invention.

With reference again to FIG. 1, the pattern density influence estimator 324 calculates a difference between the test CD and the reference CD at same measuring point. Based on the difference, the pattern density influence estimator 324 quantifies the CD variations of which behavior depend on the pattern density of the mask. FIG. 9 is a sample graph showing the CD variations, where the horizontal axis represents a distance from the side of the projected opening 43a shown in FIG. 7 or a broken line in FIG. 8, and the vertical axis represents the CD in the projected grating pattern 42 or the projected grating pattern 44. As shown in FIGS. 7 and 8, since the CDs are measured in four directions, average measured values of the CDs are plotted in the sample graph. As shown in FIG. 9, the closer to the side of the projected opening 43a each of the measuring points is, the narrower the test CD is. Contrary, the reference CD is substantially constant even though the measuring points are changed.

A flare is the one of the primary factors causing such CD variations. The flare intensity depends on the pattern density of an area surrounding the opening 14a shown in FIG. 3. With reference again to FIG. 9, an effective range of the flare reaches about 200 μm. Therefore, the pattern density influence estimator 324 estimates that effective range of the primary factors causing the CD variations reaches about 200 μm on the wafer in case where the combination of the exposure tool 3, the test mask for flare testing shown in FIG. 3, the heater 5 shown in FIG. 1, and the developing tool 4 is employed. Also, the pattern density influence estimator 324 evaluates the effective range of the primary factors by using the projected openings 43b, 43c shown in FIG. 5.

With reference again to FIG. 1, an input unit 312, an output unit 313, a program memory 330, and a temporary memory 331 are also connected to the CPU 300. A keyboard and a mouse may be used for the input unit 312. An LCD and an LED may be used for the output unit 313. The program memory 330 stores a program instructing the CPU 300 to transfer data with apparatuses connected to the CPU 300. The temporary memory 331 stores a temporary data calculated during operation by the CPU 300.

Figure 10:
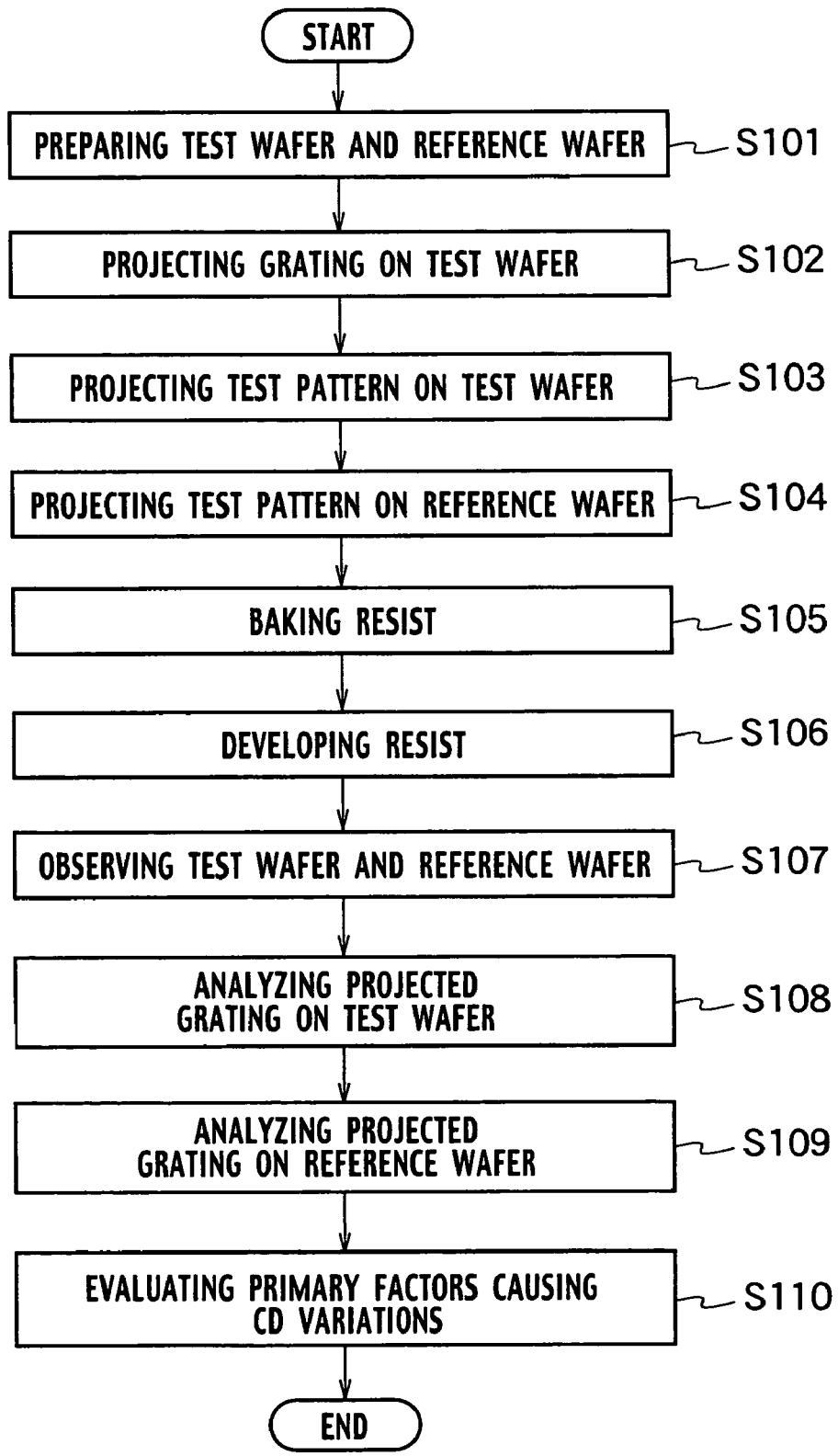
FIG. 10 is a flowchart depicting a method for evaluating lithography process in accordance with the first embodiment of the present invention.

With reference next to FIG. 10, a method for evaluating lithography process according to the first embodiment of the present invention is described.

In step S101, the test wafer and the reference wafer are prepared by coating the anti-reflection and the resist on the silicon wafers. Same coating condition as manufacturing process employs is used for preparing the test wafer and the reference wafer.

In step S102, the exposure tool 3 shown in FIGS. 1 and 2 projects the image of the grating pattern 12 shown in FIG. 3 onto the exposure filed on the test wafer under an optimized exposure condition. In step S103, the exposure tool 3 shown in FIGS. 1 and 2 projects the image of the test pattern 13 onto the identical exposure field where the image of the grating pattern 12 is projected under the optimized exposure condition. It should be noted that instead of carrying out step the S102 and then the step S103, the step S103 may be carried out before the step S102.

In step S104, the exposure tool 3 shown in FIGS. 1 and 2 projects the image of the grating pattern 12 shown in FIG. 3 onto the exposure filed on the reference wafer under the optimized exposure condition. In step S105, the test wafer and the reference wafer are baked by the heater 5 shown in FIG. 1 in order to per form the PEB process. In step S106, the resist on the test wafer and the reference wafer are developed by using the developing tool 4.

In step S107, the microscope 332 obtains the test observation image by observing the surface of the resist coated on the test wafer. Also, the microscope 332 obtains the reference observation image by observing the surface of the resist coated on the reference wafer.

In step S108, the measuring module 323 sets the test coordinate system on the test observation image as shown in FIG. 7. Further, the measuring module 323 sets the measuring points on the test observation image. Thereafter, the measuring module 323 measures the test CD at each of the measuring points in the projected grating pattern 42. Similarly, the measuring module 323 measures the test CD around the projected openings 43b, 43c shown in FIG. 5.

In step S109, the measuring module 323 shown in FIG. 1 sets the reference coordinate system and the measuring points on the reference observation image as shown in FIG. 8. Thereafter, the measuring module 323 measures the reference CD at each of the same measuring points in the projected grating pattern 44 as in the case of the test observation image.

In step S110, the pattern density influence estimator 324 shown in FIG. 1 quantifies the CD variations based on the difference between the test CD and the reference CD. Based on the quantification, the pattern density influence estimator 324 estimates the effective range of the primary factors causing the CD variations when the exposure tool 3, the test mask for the flare testing shown in FIG. 3, the heater 5, and the developing tool 4 are used.

The estimated effective range of the primary factors causing the CD variations is accurate. The reason that the estimated effective range is accurate is described below. As shown in FIG. 3, the grating pattern 12 of the test mask for the flare testing is a periodic pattern. Therefore, the pattern density is uniform in the grating pattern 12. In this case, a manufacturing error in a line width of the grating pattern 12 may be reduced when the test mask for the flare testing is manufactured. Consequently, the CDs in the projected image of the grating pattern 12 are even when the image of the grating pattern 12 is only projected onto the exposure field of the reference wafer as shown in FIG. 9. Based on the even CDs observed in the reference wafer, it is possible to conclude that the CD variations observed in the test wafer are caused by the projection of the test pattern 13 shown in FIG. 3, and the CD variations in the test wafer are not caused by the manufacturing error of the grating pattern 12.

In an earlier mask for the flare testing, grating patterns are surrounded by shield patterns Therefore, a uniformity of the local pattern density in the earlier mask falls. Accordingly, the manufacturing error in the line width may be generated in the grating patterns when the earlier mask is manufactured. Contrary, the grating pattern 12 shown in FIG. 3 and the test pattern 13 are disposed on the different portions of the mask substrate 11 in the test mask for flare testing according to the first embodiment. Even though the manufacturing error in the line width may be generated in a peripheral region of the grating pattern 12, it may not affect the CD variations in a region of the projected grating pattern 42 surrounding the projected opening 43a. Therefore, the quantified CD variations are not affected by the manufacturing error of the line width. Consequently, it is possible to estimate the property of the primary factors causing the CD variations accurately. Also, it is possible to evaluate a lithography process based on the estimated primary factors.

In addition, the CD variations in the projected grating pattern 42 are measured around the projected openings 43a, 43b, 43c on the test wafer. By comparing the CD variations, it is possible to evaluate a distribution of the CD variations on the test wafer.

In FIG. 10, setting an exposure condition for the projection of the test pattern 13 in step S103 that is different from the exposure condition for the grating pattern 12 in step S102 is an alternative. For example, by setting a dose in step S103 that is higher than in step S102, it is possible to intentionally increase the influence of the primary factors causing the CD variations. Such primary factors contain not only a mid range flare generated around the openings 14a, 14b, 14c but also an acid diffusion into the air and accumulation on the resist surface during the PEB process of step S105 and an unevenness of a concentration of the developer during the developing process in step S106. Therefore, even if the flare intensity generated in the exposure tool 3 is low, the amount of the acid diffusion into the air and accumulation on the resist surface is small, or an influence of the unevenness of the concentration of the developer is not so strong, it is possible to detect a minute primary factors causing the CD variations.

Modification of the First Embodiment

The primary factors causing the CD variations may contain the mid range flare generated in the exposure tool 3 shown in FIG. 1, the acid diffusion into the air and accumulation on the resist surface during the PEB process by the heater 5, and the unevenness of the concentration of the developer during the developing by the developing tool 4. Therefore, the CD variations measured in the step S110 are influenced by such plural factors. However, it is possible to evaluate a property of a single primary factor causing the CD variations as follows.

A friction force microscope and a phase microscope make it possible to observe a latent image in the undeveloped resist. Therefore, by using the friction force microscope or the phase microscope for the microscope 332, it is possible to observe latent images of the projected grating pattern and the projected opening on the test wafer without a resist process such as the PEB process and the developing. By evaluating the observed latent images with the measuring module 323 and the pattern density influence estimator 324, it is possible to quantify the influence of the mid range flare excluding the influence of other primary factors causing the CD variations.

Observing latent images on the test wafer and the reference wafer with the microscope 332 after the PEB process is an alternative. By evaluating such latent images with the measuring module 323 and the pattern density influence estimator 324, it is possible to quantify the influences of the mid range flare and the acid diffusion into the air and accumulation on the resist surface excluding the influence of the unevenness of the concentration of the developer. Further, it is possible to quantify the influence of the acid diffusion into the air and accumulation on the resist surface by subtracting the quantified influence of the mid range flare from the quantified influences of the mid range flare and the acid diffusion into the air and accumulation on the resist surface.

Figure 11:
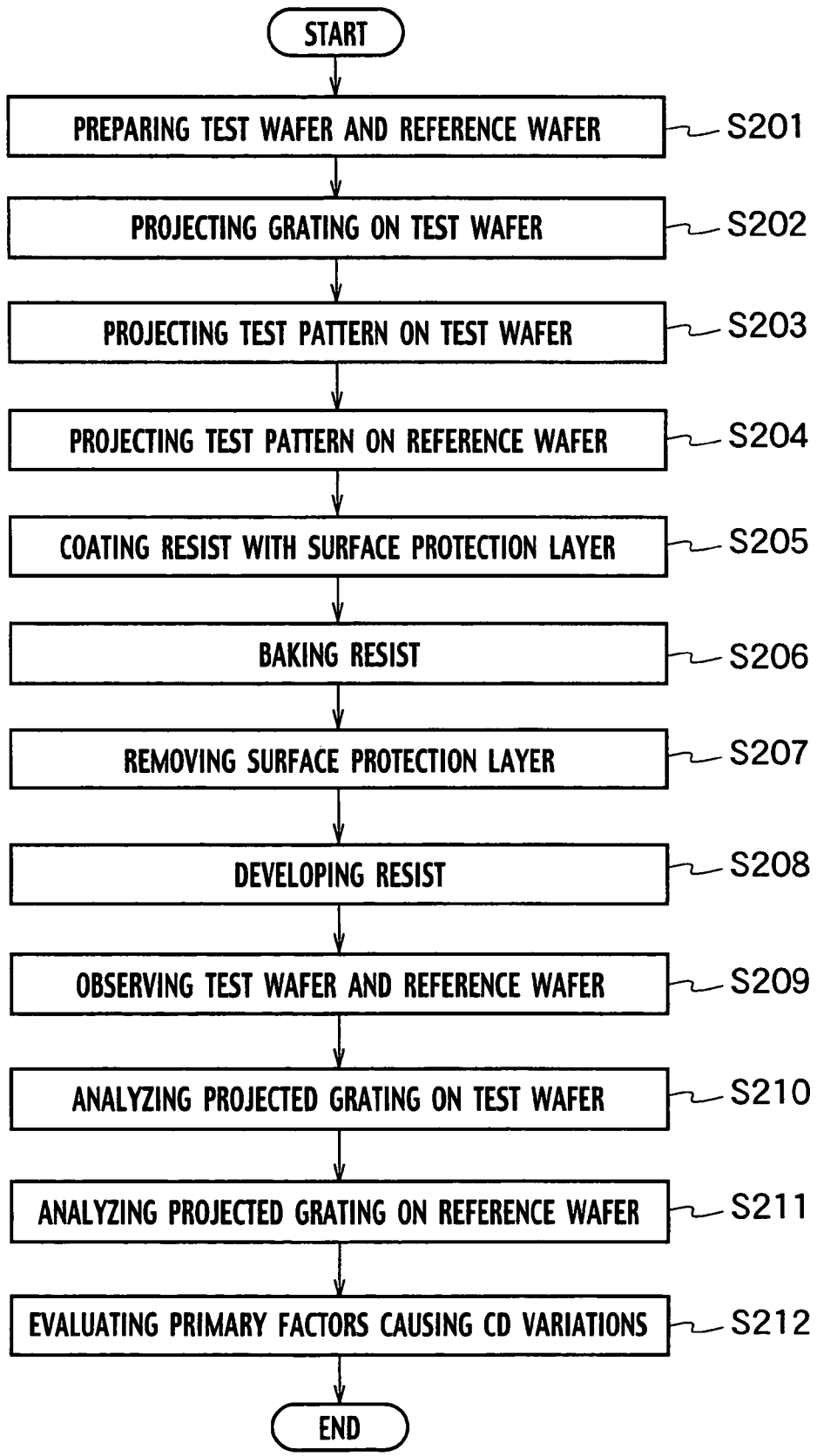
FIG. 11 is a flowchart depicting a method for evaluating lithography process in accordance with a first modification of the first embodiment of the present invention.

With reference next to FIG. 11, a method for evaluating lithography process according to a first modification of the first embodiment is described. Step S201 to step S204 are similar to the step S101 to the step S104. In step S205, surface protection layers are coated on the resists of the test wafer and the reference wafer. Anti-reflection materials such as acidity soluble polymers can be used for the surface protection layers. After step S206 is carried out, the test wafer and the reference wafer are immersed in water to remove the surface protection layers in step S207. Thereafter, step S208 to step S212 are carried out similarly to the processes of the step s106 to step S110.

By covering the resist with the surface protection layers, it is possible to reduce the acid diffusion into the air and accumulation on the resist surface during the PEB process in the step S206. Therefore, it is possible to quantify the influences of the mid range flare and the unevenness of the concentration of the developer excluding the influence of the acid diffusion into the air and accumulation on the resist surface in the step S212. Further, it is possible to quantify the influence of the unevenness of the concentration of the developer by subtracting the quantified influence of the mid range flare from the quantified influences of the mid range flare and the unevenness of the concentration of the developer.

Second Embodiment

Figure 12:
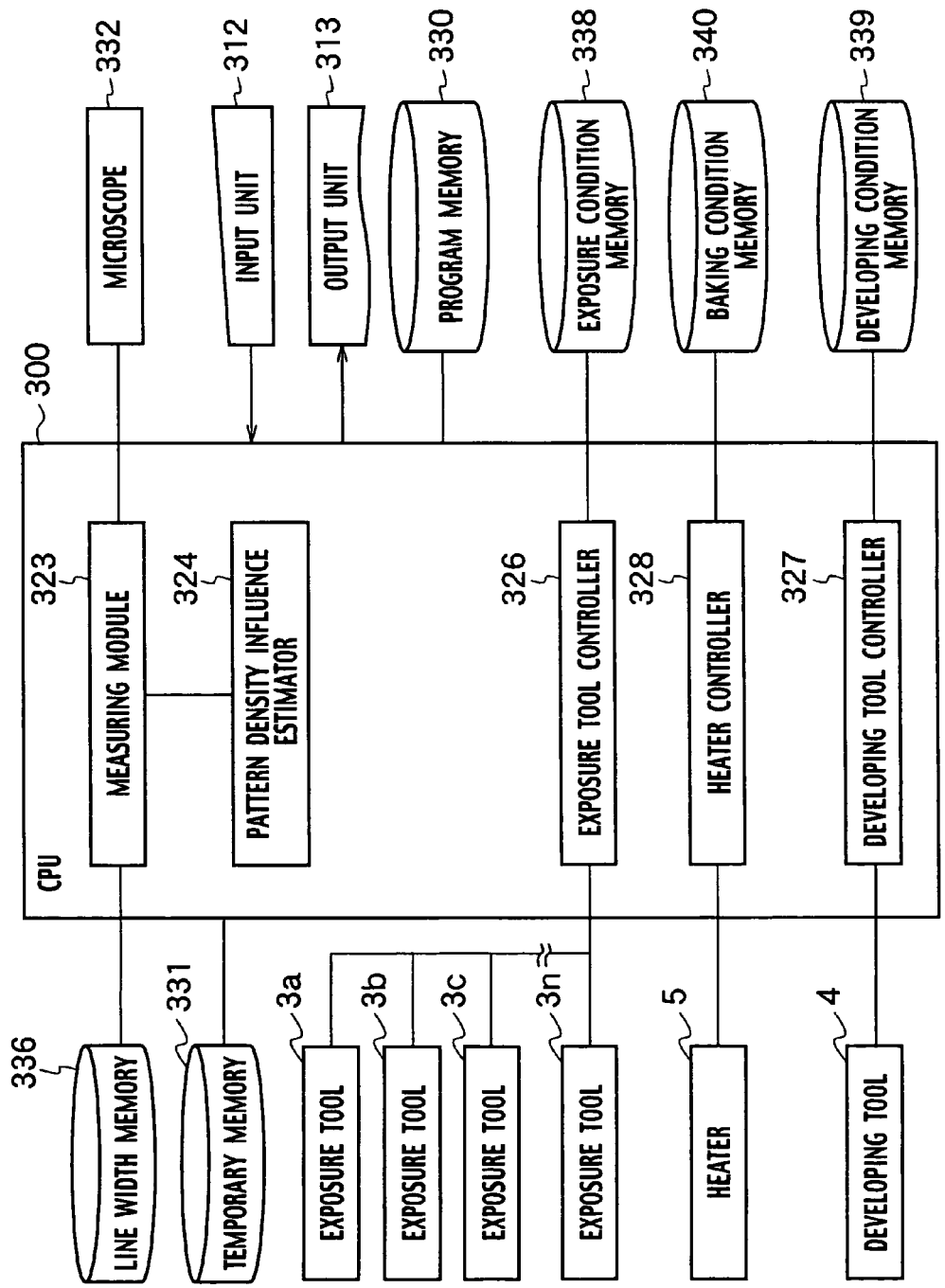
FIG. 12 is a diagram of the exposure system in accordance with a second embodiment of the present invention.

With reference to FIG. 12, an exposure system according to a second embodiment further has a plurality of the exposure tools 3a, 3b, 3c, . . . , 3n connected to the CPU 300. Each structure of the exposure tools 3a-3n is similar to a structure of the exposure tool 3 shown in FIG. 2. Other components of the exposure system shown in FIG. 12 are similar to components of the exposure system shown in FIG. 1.

Figure 13:
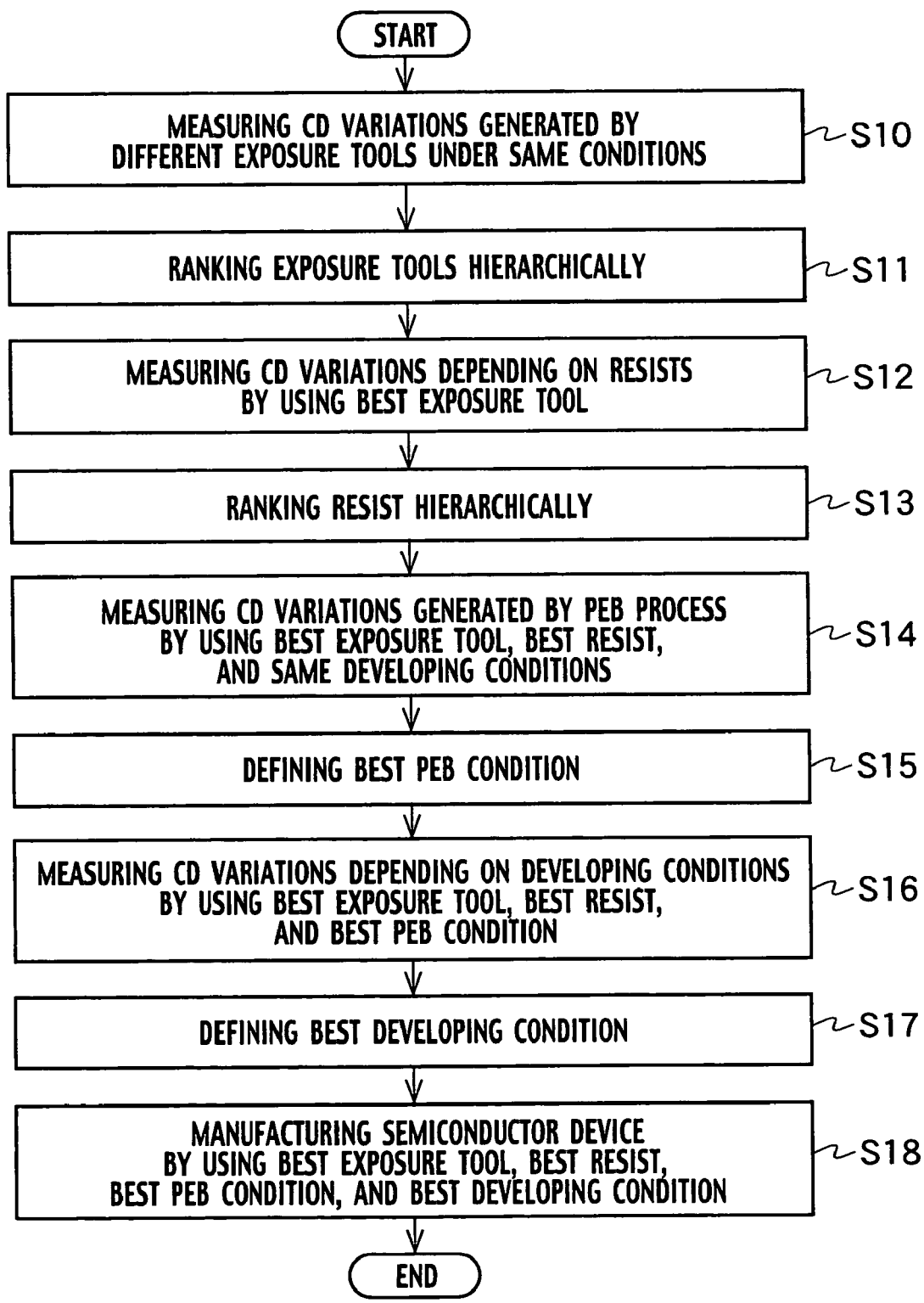
FIG. 13 is a flowchart depicting a method for manufacturing a semiconductor device in accordance with the second embodiment of the present invention.

With reference next to FIG. 13, a method for manufacturing a semiconductor device according to the second embodiment of the present invention is described.

Figure 14:
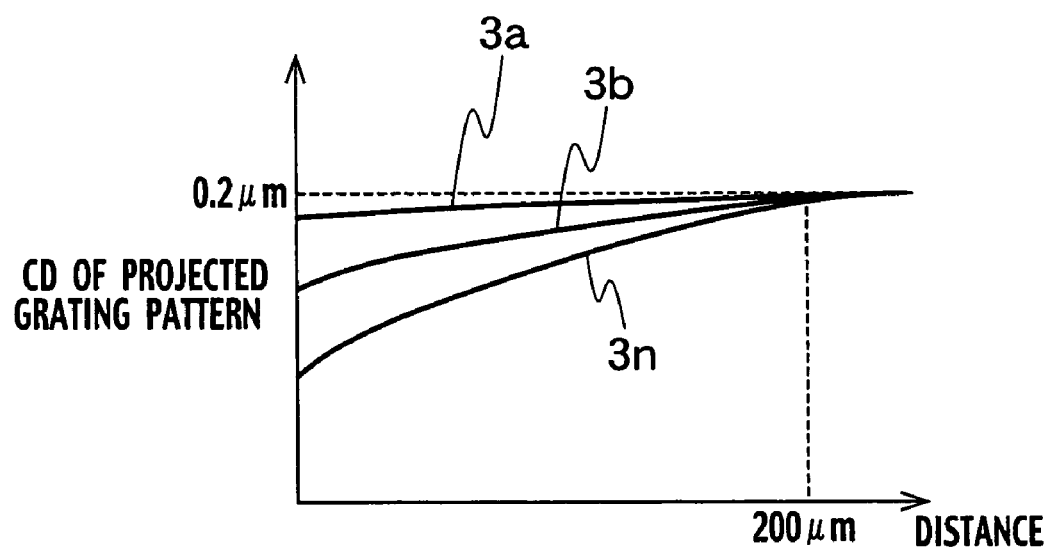
FIG. 14 is a sample graph showing an exposure tool dependency of flare in accordance with the second embodiment of the present invention.

In step S10, a plurality of the test wafers and a plurality of the reference wafers are prepared by using the same resist. The prepared test wafers and reference wafers are installed into the exposure tools 3a-3n shown in FIG. 12 respectively. Thereafter, the method for evaluating the lithography process shown in FIG. 10 is carried out by each of the exposure tools 3a-3n shown in FIG. 12 respectively. In this case, the same exposure condition, the same baking condition, and the same developing condition are employed in each procedure shown in FIG. 10 carried out by each of the exposure tools 3a-3n. Consequently, the CD variations in the projected grating pattern 42 shown in FIG. 7 formed by each of the exposure tools 3a-3n shown in FIG. 12 is quantified. FIG. 14 is a sample graph showing the result of the CD variations generated by each of the exposure tools 3a-3n.

In step S11 of FIG. 13, the exposure tools 3a-3n shown in FIG. 12 are ranked hierarchically based on the generated CD variations. As shown in FIG. 14, the CD variations generated by the exposure tool 3a shown in FIG. 12 is the smallest and the CD variations generated by the exposure tool 3n is the largest. In this case, the exposure tool 3a is determined as the best exposure tool.

In step S12 of FIG. 13, test wafers and reference wafers are prepared again. In this case, the test wafers are coated with different resists respectively. Correspondently, the reference wafers are also coated with the different resists respectively. Thereafter, the method for evaluating the lithography process shown in FIG. 10 is carried out by using the best exposure tool, each of the test wafers, and each of the reference wafers. When the method is carried out, the optimum baking condition for each of the resists is employed in the step S105. Also, the optimum developing condition for each of the resists is employed in the step S106. Consequently, the CD variations in the projected grating pattern 42 shown in FIG. 7 formed in each of the resists are quantified.

In step S13 of FIG. 13, the resists are ranked hierarchically based on the generated CD variations A resist showing the smallest CD variations is determined as the best resist.

In step S14, the method for evaluating lithography process shown in FIG. 10 is carried out by using the best exposure tool and the best resist. The method is repeated by using different baking conditions. In step S15 of FIG. 13, the baking conditions are ranked hierarchically based on the generated CD variations. A baking condition providing the smallest CD variations is determined as the best baking condition.

In step S16, the method for evaluating lithography process shown in FIG. 10 is carried out by using the best exposure tool, the best resist, and the best baking condition. The method is repeated by using different developing conditions. In step S17 of FIG. 13, the developing conditions are ranked hierarchically based on the generated CD variations. A developing condition providing the smallest CD variations is determined as the best developing condition.

In step S18, a mask pattern of the semiconductor device is projected onto a wafer to be manufactured by using the best exposure tool, the best resist, the best baking condition, and the best developing condition. Accordingly, a device pattern of the semiconductor device is produced on the wafer. Thereafter, the PEB process and the developing are repeated until the manufacturing process of the semiconductor device is completed.

According to the method for manufacturing the semiconductor device shown in FIG. 13, it is possible to choose the best lithography condition such as the best exposure tool, the best resist, the best baking condition, and the best developing condition, which reduce the CD variations. Therefore, a yield rate of the semiconductor device is effectively increased.

It should be noted that turn to determine the best exposure tool, the best resist, the best baking condition, and the best developing condition is not limited to the method shown in FIG. 13. Also, manufacturing the semiconductor device after determining at least one of the best exposure tool, the best resist, the best baking condition, and the best developing condition is an alternative.

Further, carrying out the method shown in FIG. 10 by using prepared combinations of the baking conditions and the developing conditions to choose the best combination reducing the CD variations is also the alternative. Besides choosing the best conditions, choosing appropriate conditions causing the CD variations that are below a permissible value is also alternative.

Third Embodiment

Figure 15:
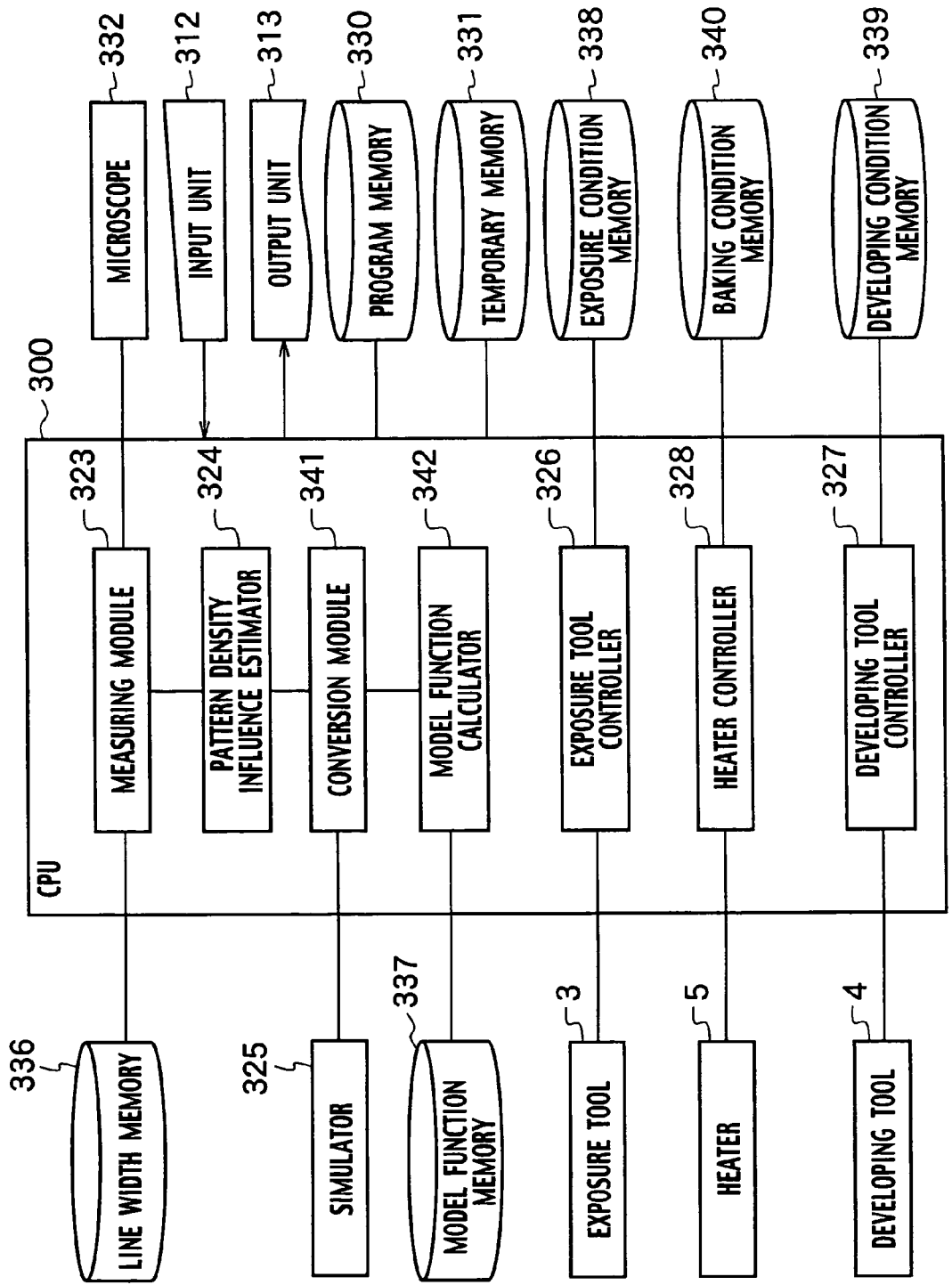
FIG. 15 is a diagram of the exposure system in accordance with a third embodiment of the present invention.

With reference to FIG. 15, an exposure system according to a third embodiment further has a simulator 325 and a model function memory 337 connected to the CPU 300. Also, the CPU 300 further has a conversion module 341 and a model function calculator 342. The model function calculator 342 is configured to calculate a model function representing a distribution of amounts of the primary factors causing the CD variation. The model function calculator 342 calculates the model function based on a distribution of the CD variations.

Figure 16:
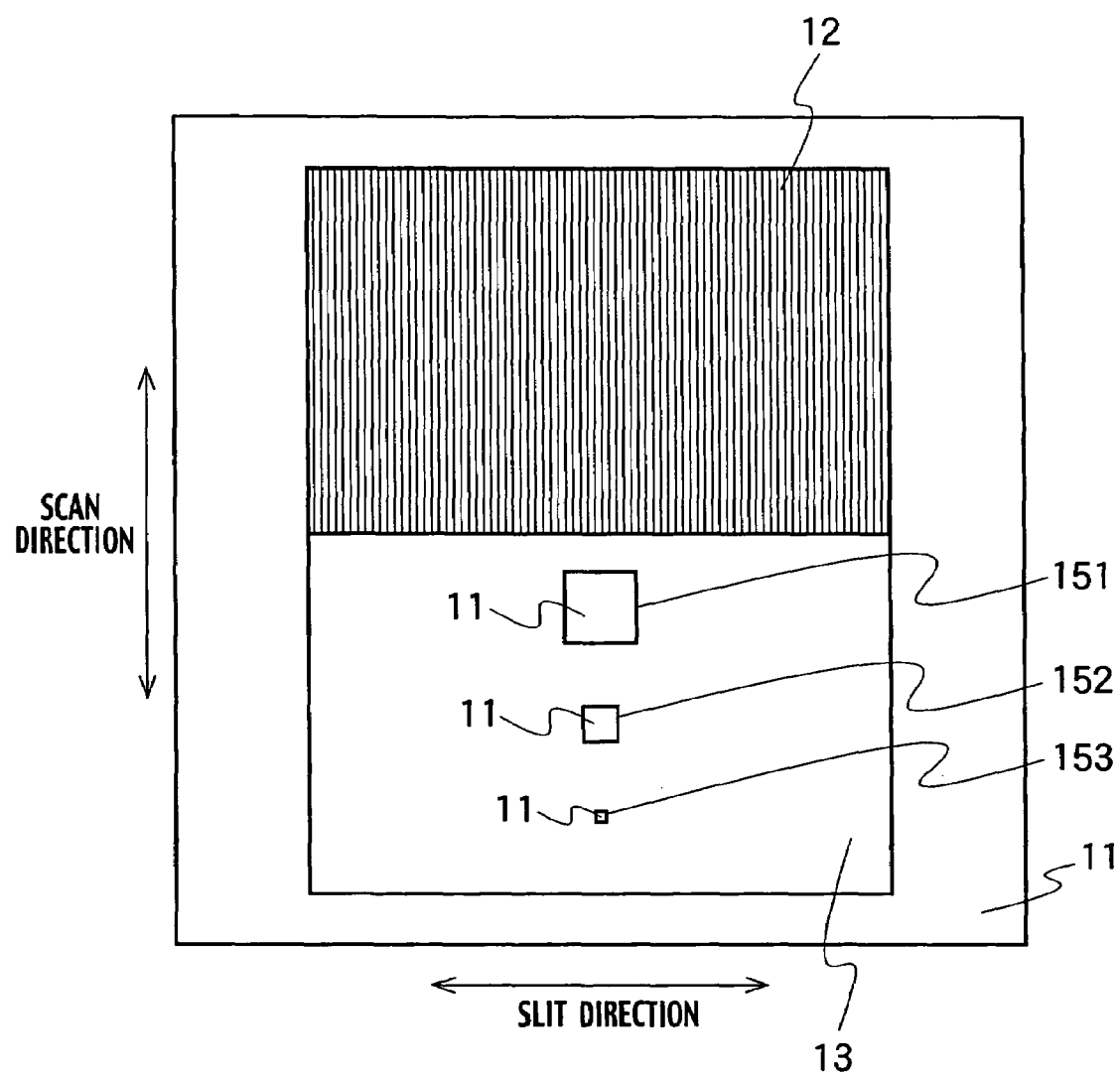
FIG. 16 is a first plan view of the test mask for the flare testing in accordance with the third embodiment of the present invention.

With reference next to FIG. 16, a test mask for flare testing according to the third embodiment has a test pattern 13 disposed on the mask substrate 11. A plurality of openings 151, 152, 153 are delineated in the test pattern 13. The parallel openings 151-153 are arranged in a scan direction. Shapes of the openings 151-153 are similar. For example, a square side length of the opening 151 is 4,000 μm. A square side length of the opening 152 is 2,000 μm. And a square side length of the opening 153 is 400 μm. Other components of the mask are similar to the mask shown in FIG. 3. The test mask for the flare testing shown in FIG. 16 may be mounted on the reticle stage 115 shown in FIG. 2.

With the 1× reduction ratio, a projected image of the opening 151 would be a square of which side length is 4,000 μm. A projected image of the opening 152 would be a square of which side length is 2,000 μm And a projected image of the opening 153 would be a square of which side length is 400 μm.

Figure 17:
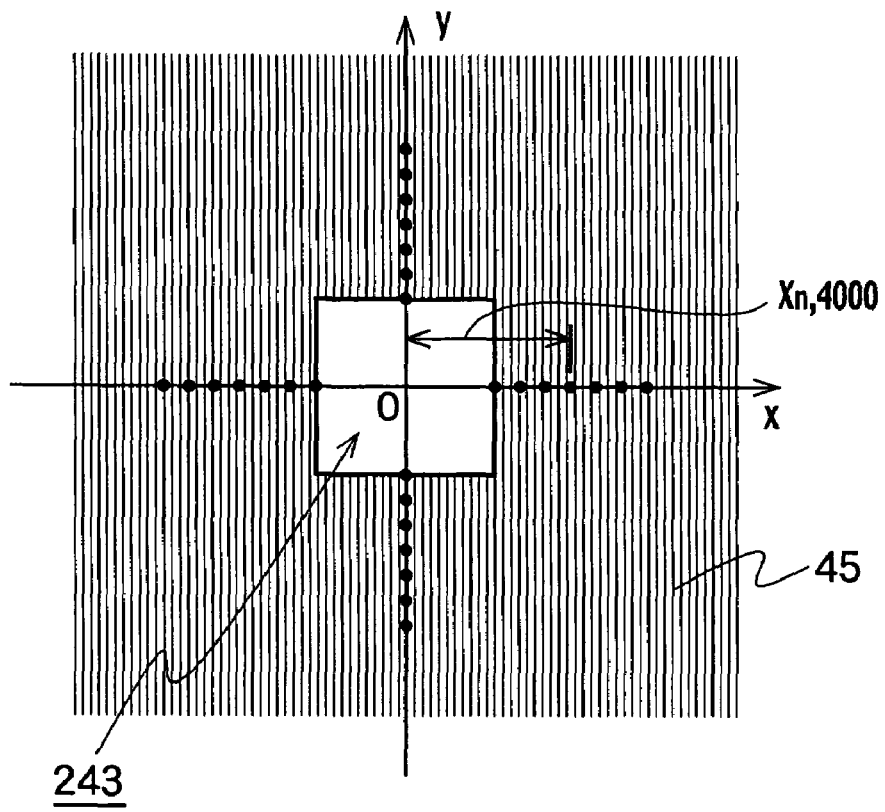
FIG. 17 is an enlarged plan view of the test wafer in accordance with the third embodiment of the present invention.

FIG. 17 shows a test observation image of a resist pattern containing a projected opening 243 surrounded by a projected grating pattern 45. The resist pattern is formed by projecting the images of the grating pattern 12 and the opening 151 shown in FIG. 16 onto the identical exposure field of the test wafer.

As shown in FIG. 17, the test coordinate system is set on the test observation image by the measuring module 323 shown in FIG. 15. The measuring module 323 defines the center of the projected opening 243 as the origin of the test coordinate system. Further, the measuring module 323 arranges a plurality of measuring points on axes of the test coordinate system from four sides of the projected opening 243 as shown in FIG. 17. In this case, the measuring module 323 shown in FIG. 15 defines a variable "$x_{n,4000}$". Here, the "n" means a natural number. The maximum of the "n" is equal to the number of the measuring points. The measuring module 323 arranges the measuring points so that each of the measuring points is "$x_{n,4000}$" distant from the origin. For example, the measuring module 323 sets a first measuring point that is "$x_{1,4000}$" distant from the origin. Further, the measuring module 323 measures the CD at each of the measuring points. The measuring module 323 averages the four CDs at the measuring points that are "$x_{n,4000}$" distant from the origin and get an average CD $A(x_{n,4000})$.

Further, the measuring module 323 measures the CD in the projected grating pattern 45 around a projected image of the opening 152 shown in FIG. 16. In this case, the measuring module 323 shown in FIG. 15 defines a variable "$x_{n,2000}$" to arrange measuring points so that each of the measuring points is "$x_{n,2000}$" distant from the center of the projected image of the opening 152. Further, the measuring module 323 averages the four CDs at the measuring points that are "$x_{n,2000}$" distant from the center and get an average CD $A(x_{n,2000})$.

Also, the measuring module 323 measures the CD in the projected grating pattern 45 around a projected image of the opening 153 shown in FIG. 16. In this case, the measuring module 323 shown in FIG. 15 defines a variable "$x_{n,400}$" to arrange measuring points so that each of the measuring points is "$x_{n,400}$" distant from the center of the projected image of the opening 153. Further, the measuring module 323 averages the four CDs at the measuring points that are "$x_{n,400}$" distant from the center and get an average CD $A(x_{n,400})$. The average CD-s $A(x_{n,4000})$, $A(x_{n,2000})$, $A(x_{n,400})$ are stored in the line width memory 336.

Figure 18:
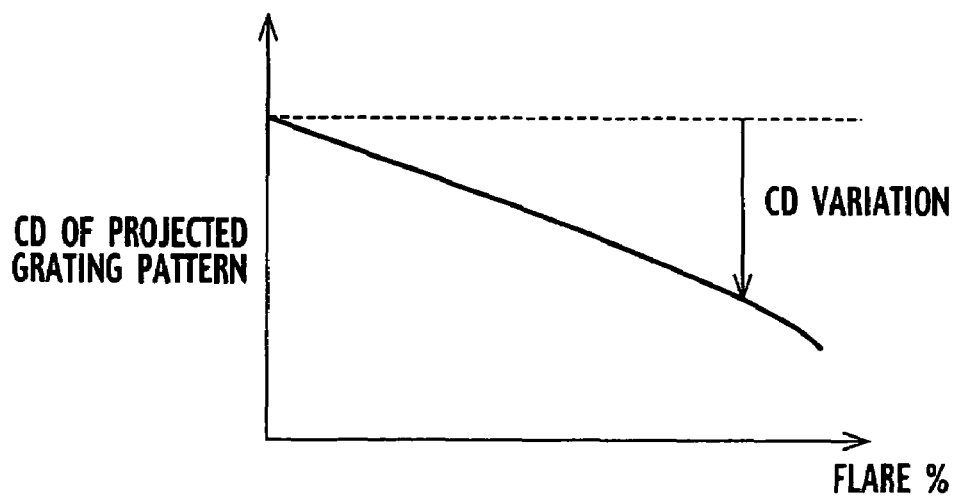
FIG. 18 is a sample graph showing a relation between flare intensity and the CD variations in accordance with the second embodiment of the present invention.

The simulator 325 simulates projections of the grating pattern 12 and the test pattern 13 shown in FIG. 16 onto the identical exposure field under various influences of the primary factor causing the CD variations to calculate a relation between the amounts of the primary factors and the CD variations in the projected image of the grating pattern 12. The simulator 325 may employ the Fourier transform to calculate the light intensity of the projected pattern and the string model to calculate the CD in the developed resist pattern. FIG. 18 is a sample graph showing a relation between the flare intensity and the CD variation at a position in the projected image of the grating pattern 12 calculated by the simulator 325.

The conversion module 341 shown in FIG. 15 is configured to convert the average CDs A($x_{n,4000}$) A ($x_{n,2000}$), A($x_{n,400}$) into the amounts of the primary factors $f_{4000}$($x_{n,4000}$) $f_{2000}$ ($x_{n,2000}$), $f_{400}$($x_{n,400}$) based on the relation between the amounts of the primary factors and the CD variations calculated by the simulator 325.

The model function calculator 342 is configured to calculate the model function representing a distribution of the amounts of the primary factors causing the CD variations based on the amounts of the primary factors $f_{4000}$($x_{n,4000}$) $f_{2000}$ ($x_{n,2000}$) $f_{400}$($x_{n,400}$). The general equation for the amounts of the primary factors at a coordinate (x, y) defined on a surface of the wafer is given by equation (1). It should be noted that the center of a projected image of a transparent pattern such as the projected opening 243 shown in FIG. 17 is defined as the coordinate origin.

$$F(x, y) = \int_{-\infty}^{+\infty} \int_{-\infty}^{+\infty} W(s, t)P(x-s, y-t)dsdt \tag{1}$$

Here, W(s, t) is 1 when the light passes through at a coordinate (s, t) defined on a mask. Contrary, W(s, t) is 0 when the light does not pass through at the coordinate (s, t). The function P(x−s, y−t) is given by equations (2) and (3).

$$P(x-s,y-t)=a_0+a_1*\exp(-b_1 r_p^2) \tag{2}$$

$$r_p=((x-s)^2+(y-t)^2)^{1/2} \tag{3}$$

Function P(x−s, y−t) represents a relation between the effective range of the primary factors in x-y coordinate system defined on the wafer and the coordinate (s, t) where the primary factors causing the CD variations may originate. In the equation (3), "$a_0$" is a constant representing a primary factor independent of the pattern density of the mask such as a long range flare. The long range flare is increased by the double exposure and does not depend on the local pattern density of the mask. In the case where the long range flare is small enough to be neglected, the "$a_0$" may be eliminated. "$a_1*\exp(-b_1 r_p^2)$" represents the primary factors depending on the pattern density of the mask such as the mid range flare, the acid diffusion into the air and accumulation on the resist surface, and the unevenness of the concentration of the developer.

The model function calculator 342 defines equations (4), (5), (6) derived from the equation (1) to calculate the model function.

$$F_{400} = \int_{-200}^{200}\int_{-200}^{200} P(x-s, t)dsdt \tag{4}$$

$$= \int_{-200}^{200}\int_{-200}^{200} \{a_0 + a_1 \exp(-b_1 r_l^2)\}dsdt$$

$$F_{2000}(x) = \int_{-1000}^{1000}\int_{-1000}^{1000} P(x-s, t)dsdt \tag{5}$$

$$= \int_{-1000}^{1000}\int_{-1000}^{1000} \{a_0 + a_1 \exp(-b_1 r_l^2)\}dsdt$$

$$F_{4000}(x) = \int_{-2000}^{2000}\int_{-2000}^{2000} P(x-s, t)dsdt \tag{6}$$

$$= \int_{-2000}^{2000}\int_{-2000}^{2000} \{a_0 + a_1 \exp(-b_1 r_l^2)\}dsdt$$

$$r_1 = ((x-s)^2 + t^2)^{1/2} \tag{7}$$

With reference again to FIG. 16, each center of the opening 151, 152, 153 is defined as the origin of the s-t coordinate system to derive each of the equations (4)-(6) from the equation (1). In the case where the coordinate (s, t) is located on the test pattern 13 except the openings 151, 152, 153, the W(s, t) in the equation (1) is 0.

Since the side length of the opening 153 is 400 μm, the equation (4) is defined on a closed interval [−200, 200]. Also, since the side length of the opening 152 is 2,000 μm, the equation (5) is defined on a closed interval [−1,000, 1,000]. In the case of the opening 151 of which side length of is 4,000 μm, the equation (6) is defined on a closed interval [−2,000, 2,000].

It is possible to assume that the distribution of the flare is isotropic. Therefore, a variable "y" is eliminated in the equations (4)-(6) Consequently, a variable "x" in each of the equations (4)-(6) means the distance from each center of the projected images of the openings 151, 152, 153.

Further, the model function calculator 342 generates a sum of squares "S" given by equation (8) based on the amount of the primary factors $f_{4000}$($x_{n,4000}$) at the position being $x_{n,4000}$ distant from the center of the projected image of the opening 151 shown in FIG. 16, the amount of the primary factors $f_{2000}$ ($x_{n,2000}$) at the position being $x_{n,2000}$ distant from the center of the projected image of the opening 152, the amount of the primary factors $f_{400}$($x_{n,400}$) at the position being $x_{n,400}$ distant from the center of the projected image of the opening 153, and the equations (4)-(6).

$$S = \sum_n [F_{400}(x_{n,400}) - f_{400}(x_{n,400})]^2 + \\ \sum_n [F_{2000}(x_{n,2000}) - f_{2000}(x_{n,2000})]^2 + \\ \sum_n [F_{4000}(x_{n,4000}) - f_{4000}(x_{n,4000})]^2 \tag{8}$$

The model function calculator 342 calculates a combination of constants "$a_0$", "$a_1$", "$b_1$" that minimize the sum of the square "S" given by the equation (8). The model function calculator 342 employs the steepest descent method or the simplex method to calculate the combination for example. To carry out the calculation, the model function calculator 342 defines an appropriate initial value to each of the "$a_0$", "$a_1$", "$b_1$".

Further, the model function calculator 342 generates a function $P_1$(x,y) given by equations (9) and (10) by using the constants "$a_1$", "$b_1$" minimizing the sum of the square "S". The function $P_1$(x,y) represents a relation between the amounts of the primary factors and the effective range of the primary factors.

$$P_1(x,y)=a_1*\exp(-b_1 r^2) \tag{9}$$

$$r=(x^2+y^2)^{1/2} \tag{10}$$

The model function calculator 342 generates the model function F(x, y) given by equation (11) based on the equation (9). The model function F(x, y) can be used to calculate the distribution of the amounts of the primary factors for any mask pattern.

$$F(x, y) = \int_{-c}^{c}\int_{-c}^{c} M(s, t)P_1(x-s, y-t)dsdt \tag{11}$$

Here, M(s, t) is a function representing a transparency in the coordinate (s, t) on the mask pattern. For example, M(s, t) is 1 in a transparent portion and M(s, t) is 0.06 in a 6% attenuated phase shifter. An appropriate value is defined as the endpoint "c" of the interval based on the fact that the gauss function $P_1(x, y)$ given by the equation (9) converges to 0 as the number of "r" increases without limit. The model function F(x, y) given by the equation (11) is stored in the model function memory 337. Other components of the exposure system shown in FIG. 15 are similar to components of the exposure system shown in FIG. 1.

Figure 19:
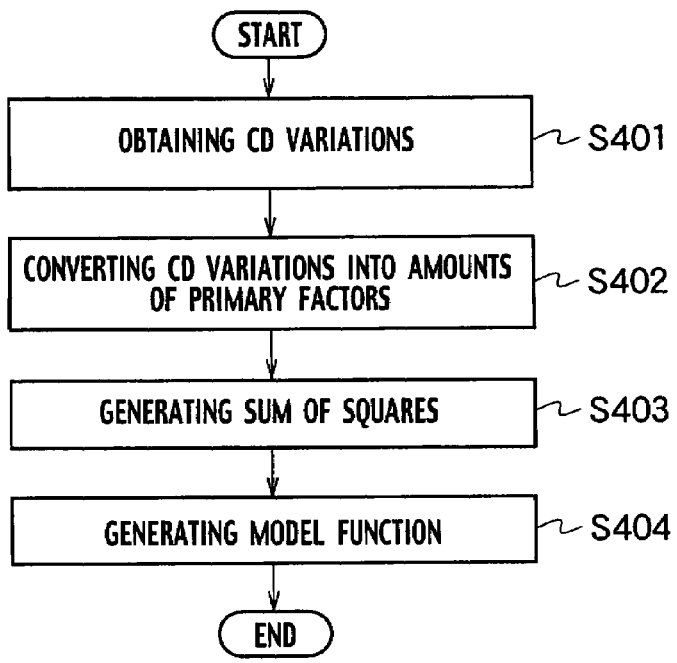
FIG. 19 is a flowchart depicting a method for evaluating lithography process in accordance with the third embodiment of the present invention.

With reference next to FIG. 19, the method for evaluating the lithography process according to the third embodiment is described.

In step S401, the method for evaluating the lithography process shown in FIG. 10 is carried out with the test mask for the flare testing shown in FIG. 16. Accordingly, the CD variations of the grating pattern 12 projected on the test wafer are measured around the projected images of the openings 151, 152, 153 on the test wafer. Here, the measuring module 323 obtains the average CDs $A(x_{n,4000})$ $A(x_{n,2000})$, $A(x_{n,400})$ as described above.

In step S402, the simulator 325 shown in FIG. 15 calculates the relation between the amounts of the primary factors and the CD variations. Further, the conversion module 341 converts average CDs $A(x_{n,4000})$, $A(x_{n,2000})$, $A(x_{n,400})$ into the amounts of the primary factors $f_{4000}(x_{n,4000})$, $f_{2000}(x_{n,2000})$, $f_{400}(x_{n,400})$ by using the relation calculated by the simulator 325.

In step S403, the model function calculator 342 calculates the combination of constants "$a_0$", "$a_1$" "$b_1$" that minimize the sum of the square "S" given by the equation (8) based on the calculated amount of the primary factors by using the equations (1)-(7). Further, the model function calculator 342 generates the function $P_1(x,y)$ given by equation (9) by using the constants "$a_1$", "$b_1$" minimizing the sum of the square "S". In step S404, the model function calculator 342 generates the model function F(x, y) given by the equation (11) based on the equation (9).

As described above, the exposure system shown in FIG. 15 and the method for evaluating the lithography process shown in FIG. 19 make it possible to generalize the distribution of the primary factors causing the CD variations from the measured CD variations with the test mask for the flare testing shown in FIG. 16. Further, it is possible to generate the model function given by the equation (11). By using the equation (11), the distribution of the amount of the primary factors in the x-y coordinate system defined on the wafer is calculated even though any mask pattern is used.

Though three openings 151-153 are delineated in the test pattern 13 in FIG. 16, it should be noted that the number of the openings is not limited to three and more openings may be delineated in the test pattern 13. Also, each design size of the openings 151-153 is variable. When each size is changed, each interval of the equations (4)-(6) is changed correspondingly.

Since the primary factors such as the mid range flare intensity shows similar property in the scan direction of the step and scan exposure, the parallel openings 151-153 are arranged in the scan direction. However, the mid range property may change along a slit direction that is perpendicular to the scan direction. Therefore, providing a plurality of model functions F(x, y) along the slit direction is an alternative.

Figure 20:
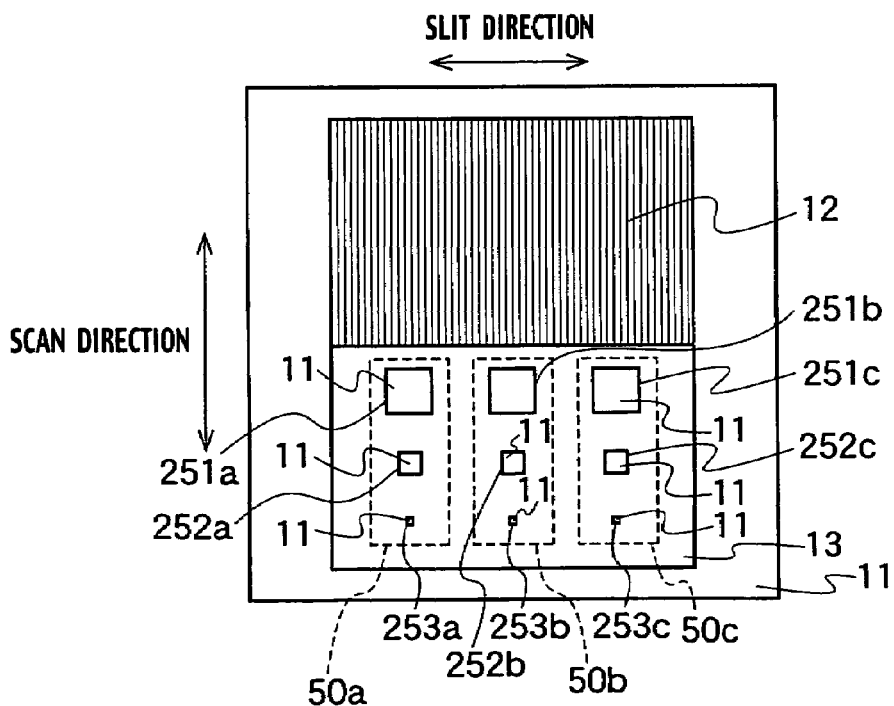
FIG. 20 is a second plan view of the test mask for the flare testing in accordance with the third embodiment of the present invention.

FIG. 20 shows a modification of the test mask for the flare testing to obtain the plural model functions. The test pattern 13 has a plurality of opening pattern sets 50a, 50b, 50c. The parallel opening pattern sets 50a-50c are arranged in the slit direction. The opening pattern set 50a has a plurality of parallel openings 251a, 252a, 253a in the scan direction. And the opening pattern set 50b has a plurality of parallel openings 251b, 252b, 253b in the scan direction. Also, the opening pattern set 50c has a plurality of parallel openings 251c, 252c, 253c in the scan direction. By repeating the method shown in FIG. 19 with each of the projected image of the openings 251c-253c, it is possible to generate the plural model functions F(x, y) and precisely calculate the distribution of the primary factors for any mask pattern.

First Modification of the Third Embodiment

As described above, the "$a_1 * \exp(-b_1 r_p^2)$" in the equation (2) represents the primary factors of the CD variations depending on the pattern density. Such primary factors may contain the mid range flare caused by the exposure tool 3 shown in FIG. 15, the acid diffusion into the air and accumulation on the resist surface during the PEB process by the heater 5, and the unevenness of the concentration of the developer during the developing process by the developing tool 4.

However, it is possible to calculate the amounts of the primary factors $f_{4000}(x_{n,4000})$, $f_{2000}(x_{n,2000})$, $f_{400}(x_{n,400})$ representing only the intensity of the mid range flare and the unevenness of the developer excluding the acid diffusion into the air and accumulation on the resist surface. As described in the explanation of FIG. 11, by coating the surface protection layer on the resist, it is possible to prevent the acid from diffusing and being consumed during the PEB process. Therefore, by observing the developed resist pattern on the test wafer and the reference wafer with the microscope 332, and by obtaining the relation between the intensity of the mid range flare and the unevenness of the developer and the CD variations by the simulator 325, it is possible to obtain the amount of the primary factors $f_{4000}(x_{n,4000})$, $f_{2000}(x_{n,2000})$, $f_{400}(x_{n,400})$ representing only the intensity of the mid range flare and the unevenness of the developer by the conversion module 341. Therefore, it is possible to generate the function $P_1(x,y)$ representing the amount of the primary factors containing only the intensity of the mid range flare and the unevenness of the developer and the effective range.

Further, by using the constants "$a_1$", "$b_1$" minimizing the sum of the square "S" and substituting equation (12) for equation (2), the method for evaluating the lithography process shown in FIG. 19 may be carried out again to calculate the constants "$a_0$", "$a_2$", "$b_2$".

$$P_b(x-s, y-t) = a_0 + a_1 * \exp(-b_1 r_p^2) + a_2 * \exp(-b_2 r_p^2) \qquad (12)$$

In the equation (12), "$a_0$" represents the primary factors independent of the pattern density of the mask such as the long range flare, "$a_1 * \exp(-b_1 r_t^2)$" represents the mid range flare and the unevenness of the developer, and "$a_2 * \exp(-b_2 r_t^2)$" represents the acid diffusion into the air and accumulation on the resist surface. Therefore, the equation (12) can represent the CD variations caused by the acid diffusion into the air and accumulation on the resist surface independent of the influence of the mid range flare and the unevenness of the developer.

Second Modification of the Third Embodiment

The amounts of the primary factors calculated by the model function F(x, y) given by the equation (11) contains the intensity of the mid range flare generated in the exposure tool 3 shown in FIG. 15, the amount of the acid diffusion into the air and accumulation on the resist surface during the PEB process by the heater 5, and the unevenness of the concentration of the developer during the developing by the developing tool 4. However, it is possible to generate the model function representing an amount of a single primary factor causing the CD variations as follows.

By using the friction force microscope or the phase microscope for the microscope 332, it is possible to observe latent images of the projected grating pattern and the projected opening on the test wafer. Based on a relation between the intensity of the mid range flare and the CD variations in the latent images calculated by the simulator 325, the conversion module 341 calculates the amounts of the primary factors $f_{4000}(x_{n,4000})$, $f_{2000}(x_{n,2000})$, $f_{400}(x_{n,400})$ representing the mid range flare intensity only. Therefore, it is possible to generate the model function representing only the distribution of the mid range flare intensity by the model function calculator 342.

Observing latent images on the test wafer and the reference wafer with the microscope 332 after the PEB process is an alternative. Based on a relation between the CD variations in the latent images and the amount of the primary factors containing the mid range flare intensity and the acid diffusion into the air and accumulation on the resist surface calculated by the simulator 325, the conversion module 341 calculates the amounts of the primary factors $f_{4000}(x_{n,4000})$, $f_{2000}(x_{n,2000})$, $f_{400}(x_{n,400})$ representing the mid range flare intensity and the acid diffusion into the air and accumulation on the resist surface. Therefore, it is possible to generate the model function for the distribution of mid range flare intensity and the acid diffusion into the air and accumulation on the resist surface by the model function calculator 342. Further, it is possible to generate a model function representing only the acid diffusion into the air and accumulation on the resist surface by subtracting the quantified influence of the mid range flare from the quantified influences of the mid range flare and the acid diffusion into the air and accumulation on the resist surface.

As described in the explanation of FIG. 11, by coating the surface protection layer on the resist, it is possible to prevent the acid from diffusing and being consumed during the PEB process. Therefore, by observing the developed resist pattern on the test wafer and the reference wafer with the microscope 332, and by obtaining the relation between the CD variations and the amounts of the primary factors containing the mid range flare intensity and the unevenness of the developer by the simulator 325, it is possible to calculate the amount of the primary factors $f_{4000}(x_{n,4000})$, $f_{2000}(x_{n,2000})$, $f_{400}(x_{n,400})$ representing the intensity of the mid range flare and the unevenness of the developer by the conversion module 341. Therefore, it is possible to generate a model function representing the mid range flare intensity and the unevenness of the developer. Further, it is possible to generate a model function representing only the unevenness of the developer by subtracting the quantified influence of the mid range flare from the quantified influence of the mid range flare and the unevenness of the developer.

Fourth Embodiment

Figure 21:
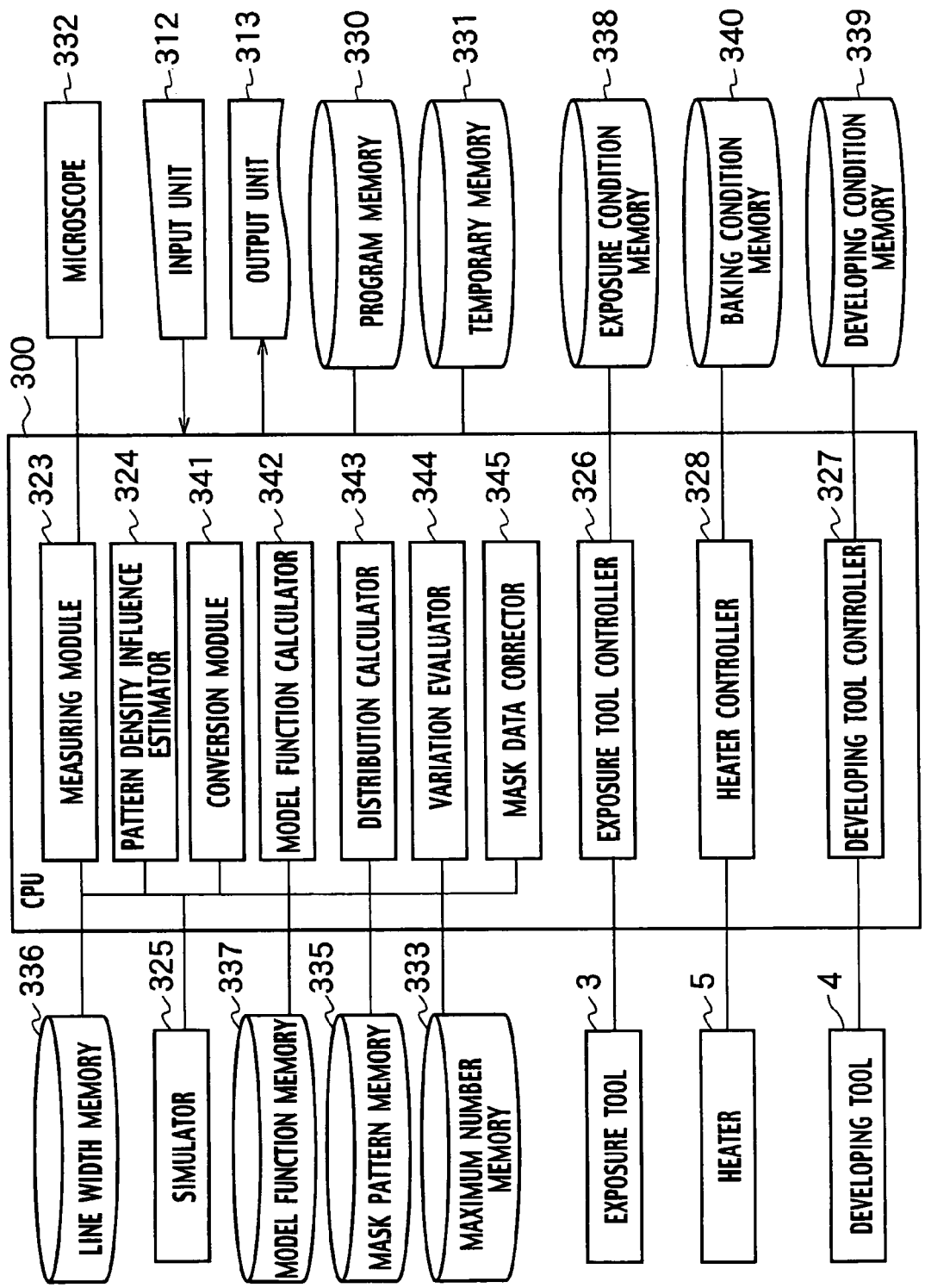
FIG. 21 is a diagram of an apparatus for generating a corrected mask pattern in accordance with a fourth embodiment of the present invention.

With reference to FIG. 21, an apparatus for generating a corrected mask pattern according to a fourth embodiment further has a mask pattern memory 335 and a maximum number memory 333 connected to the CPU 300. Also, the CPU 300 further has a distribution calculator 343, a variation evaluator 344, and a mask data corrector 345.

The mask pattern memory 335 stores design data of the mask pattern such as CAD data prepared for manufacturing a semiconductor device. The distribution calculator 343 calculates the amounts of the primary factors at the coordinate (x, y) on the wafer based on the mask pattern data stored in the mask pattern memory 335 and the model function F(x, y) given by the equation (8) stored in the model function memory 337.

The variation evaluator 344 calculates the standard deviation of the CD variations in the projected image of the mask pattern. The CD variation at the coordinate (x, y) in the projected image of the mask pattern is calculated by the simulator 325 based on the mask pattern data stored in the mask pattern memory 335. Further, the variation evaluator 344 determines whether the standard deviation of the CD variations is within a permissible value. The permissible value is set by the input unit 312.

The mask data corrector 345 corrects the mask pattern data stored in the mask pattern memory 335 based on the CD variations calculated by the simulator 325. Further, the mask data corrector 345 has an internal counter to count the number of the correction. The maximum number memory 333 stores the maximum number of the correction executed by the mask data corrector 345. Other components of the apparatus for generating the corrected mask pattern are similar to the components of the exposure system shown in FIG. 15.

Figure 22:
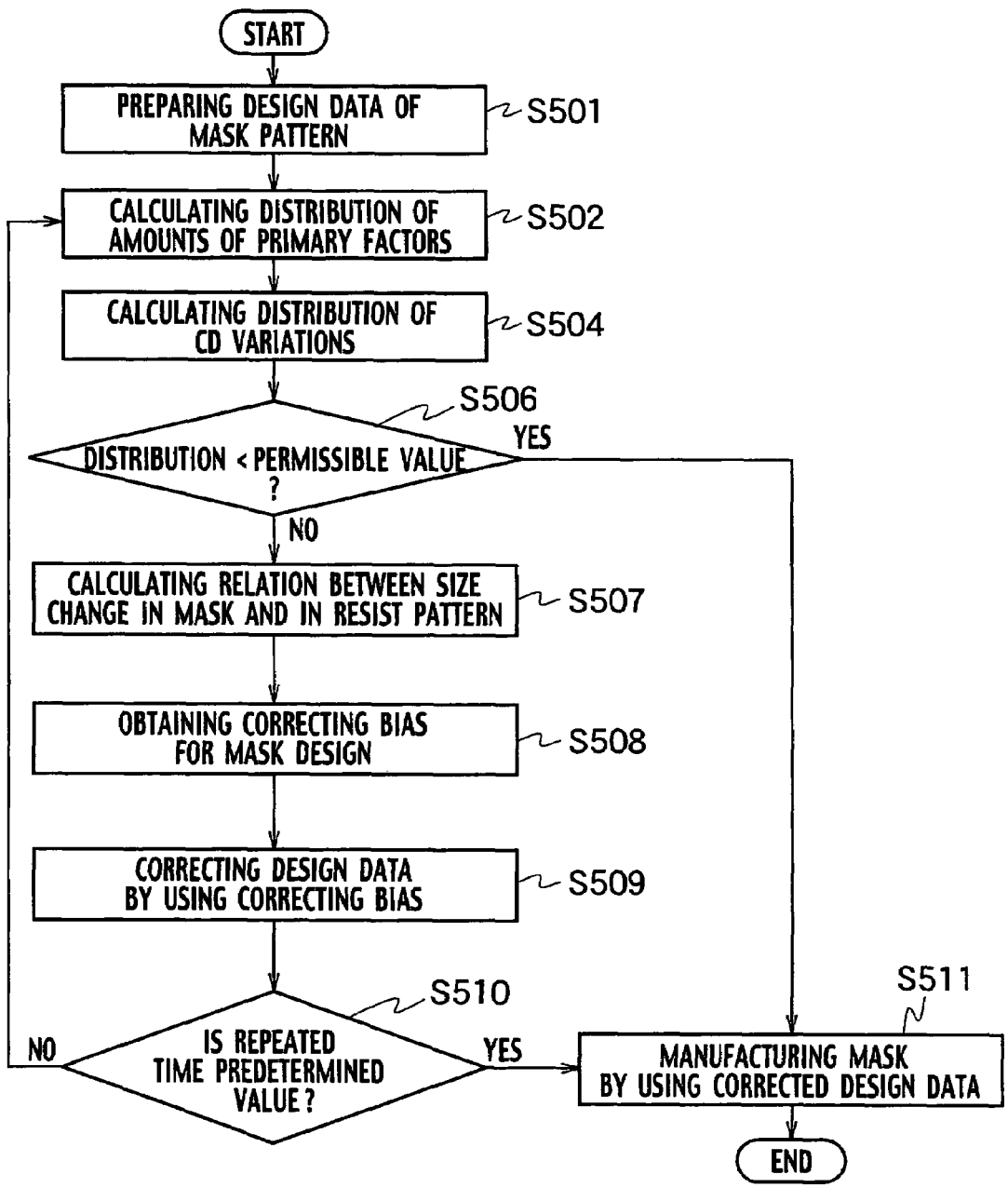
FIG. 22 is a flowchart depicting a method for generating the corrected mask pattern in accordance with the fourth embodiment of the present invention.

With reference next to FIG. 22, a method for generating a corrected mask pattern according to the fourth embodiment is described.

In step S501, the distribution calculator 343 shown in FIG. 21 reads the design data of the mask pattern stored in the mask pattern memory 335 and the model function F(x, y) given by the equation (8) stored in the model function memory 337. In step S502, the distribution calculator 343 calculates the distribution of the amount of the primary factors on the x-y coordinate system defined on the wafer based on the mask pattern data and the model function F(x, y).

In step S504, the simulator 325 calculates the distribution of the CD variations in the projected image of the mask pattern based on the design data of the mask pattern and the calculated distribution of the amounts of the primary factors causing the CD variations. In step S505, the variation evaluator 344 determines whether the standard deviation of the calculated distribution of the CD variations is within the permissible value or not. If the standard deviation is within the permissible value, step S511 is a next procedure. If the standard deviation is beyond the permissible value, step S508 is next procedure.

In step S508, the simulator 325 varies the line width of the design data of the mask pattern where the CD variation is beyond the permissible value and then calculates the CD variation in the projected mask pattern again. The simulator 325 varies the line width of the design data of the mask pattern until the CD variation is within the permissible value. In this case, the distribution of the amounts of the primary factors calculated in the step S502 is used for the calculation. When the CD variation is within the permissible value, the simulator 325 defines a bias added to the line width as the correcting bias.

In step S509, the mask data corrector 345 corrects the design data of the mask pattern stored in the mask pattern memory 335 by using the calculated correcting bias. In step S510, the mask data corrector 345 determines whether the number of the correcting times reaches the maximum number stored in the maximum number memory 333. When the number of the correcting times reaches the maximum number, step S511 is next procedure. If the number of the correcting times does not reach the maximum number, the step S502 is the next procedure. In step S511, the mask is manufactured by using the corrected design data of the mask pattern stored in the mask pattern memory 335.

Figure 23:
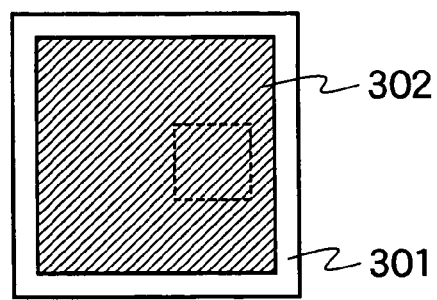
FIG. 23 is a first plane view of a mask in accordance with the fourth embodiment of the present invention.
Figure 24:
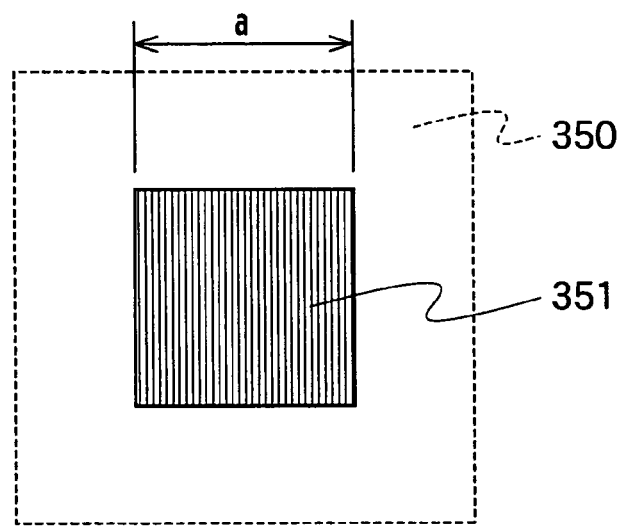
FIG. 24 is a second plane view of a mask in accordance with the fourth embodiment of the present invention.

The method for generating the corrected mask pattern shown in FIG. 22 makes it possible to manufacture the mask that reduces the CD variations generated in the projection image. Therefore, a yield rate of the semiconductor devise is increased. With reference next to FIG. 23, the mask in accordance with the fourth embodiment has a device pattern 302 surrounded by a shield layer 301. FIG. 24 depicts an enlarged plane view of an area surrounded by a broken line in FIG. 23. The device pattern 302 contains a memory cell array pattern 351 surrounded by a peripheral circuit pattern 350. The shape of the memory cell array pattern 351 is a square of which side length "a" is 5 mm, for example. The pattern density in the memory cell array pattern 351 is relatively high. Contrary, the pattern density in the peripheral circuit pattern 350 is relatively low.

Figure 25:
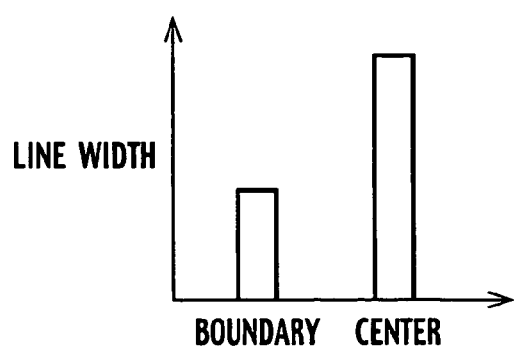
FIG. 25 is a sample graph showing a relation between the pattern density and the CD variations in accordance with the fourth embodiment of the present invention.

In the case where the mask is manufactured by earlier manufacturing method, a line width in a portion of the projected image of the memory cell array pattern 351 adjacent to the peripheral circuit pattern 350 declines in comparison with a line width in the center of the projected image of the memory cell array pattern 351 as shown in FIG. 25.

However, in the case where the mask is manufactured by using the method for generating the corrected mask pattern shown in FIG. 22, such unwanted difference of the line width is reduced since the primary factors of the CD variations depending on the pattern density of the mask is reduced effectively.

Since the local pattern density may vary by correcting the design data of the mask pattern in the step S509, the distribution of the flare intensity may vary. Therefore, when the correcting times does not reach the maximum number in the step S510, the process advances to the step S502. Accordingly, the distribution of the amounts of the primary factors depending on the pattern density is calculated again to predict the distribution of the CD variations in the projected image of the mask pattern in the step S504. Consequently, precise correction of the design data of the mask pattern is realized by the method.

Other Embodiments

Although the invention has been described above by reference to the embodiment of the present invention, the present invention is not limited to the embodiment described above. Modifications and variations of the embodiment described above will occur to those skilled in the art, in the light of the above teachings.

For example, the test mask for the flare testing shown in FIG. 3 has both grating pattern 12 and test pattern 13. However, preparing a first test mask having the grating pattern 12 and a second test mask having the test pattern 13 and carrying out the method for the evaluating lithography process shown in FIG. 10 is an alternative.

Also, the center-to-center spacing of the projected image of the grating pattern 12 shown in FIG. 3 is not limited to 0.4 μm. Further, each side length of the openings 14a, 14b, 14c is not limited to 2,000 μm. The openings 14a-14c may be spaced apart at appropriate distance and the distance is not limited to 20,000 μm. Similarly, in the test mask for the flare testing shown in FIG. 16, each size of the components is not limited to the value described in the embodiment.

As described above, the present invention includes many variations of embodiments. Therefore, the scope of the invention is defined with reference to the following claims.

What is claimed is:

1. A method for evaluating lithography process comprising:
   (a) coating a first resist on a test wafer;
   (b) projecting, onto an identical exposure field on the first resist, images of a mask, the mask including:
      a grating pattern; and
      a test pattern having an opening;
      wherein a first image of the grating pattern is a first line and space pattern having a plurality of lines between spaces, and an image of the opening in the projected image of the test pattern overlaps with a part of the first line and space pattern so that the image of the opening is surrounded by the first line and space pattern;
   (c) measuring first critical dimensions of the first line and space pattern by measuring a first line width of lines of the first line and space pattern at a plurality of first positions around the image of the opening, the first positions being assigned from an edge of the image of the opening to a surrounding area of the image of the opening in the exposure field and having different distances from the edge;
   (d) coating a second resist on a reference wafer;
   (e) protecting, onto the second resist, a second image of the grating pattern of the mask, wherein the second image of the grating pattern is a second line and space pattern having a plurality of lines between spaces;
   (f) measuring second critical dimensions of the second line and space pattern by measuring a second line width of lines of the second line and space pattern at a plurality of second positions, the second positions corresponding to the first positions; and
   (g) estimating an influence of a pattern density of the mask upon critical dimension variations by comparing the first critical dimensions and the second critical dimensions.

2. The method of claim 1, further comprising baking the resist.

3. The method of claim 1, further comprising developing the resist.

4. The method of claim 1, further comprising calculating a model function representing a distribution of primary factors causing the critical dimension variations based on a distribution of the critical dimension variations.

5. The method of claim 2, further comprising coating a surface protection layer on the resist, the surface protection layer reducing an acid diffusion into air and accumulation on the resist.

6. The method of claim 1, wherein
   the step (a) is repeated on a plurality of test wafers, the plurality of wafers each being respectively inserted into different exposure tools, respectively, the first resist being coated on each of the plurality of test wafers;
   the step (b) is performed by the respective exposure tools;
   the step (c) is performed on each of the test wafers respectively; and
   ranking the exposure tools hierarchically based on the critical dimension variations.

7. A method for generating a corrected mask pattern comprising:
   coating a first resist on a test wafer;
   projecting, onto an identical exposure field on the first resist, images of a mask, the mask including:
      a grating pattern; and
      a test pattern having an opening;
      wherein a first image of the grating pattern is a first line and space pattern having a plurality of lines between spaces, and an image of the opening in the projected image of the test pattern overlaps with a part of the first line and space pattern so that the image of the opening is surrounded by the first line and space pattern;

measuring first critical dimensions of the first line and space pattern by measuring a first line width of lines of the first line and space pattern at a plurality of first positions around the image of the opening, the first positions being assigned from an edge of the image of the opening to a surrounding area of the image of the opening in the exposure field and having different distances from the edge;

coating a second resist on a reference wafer;

projecting, onto the second resist, a second image of the grating pattern of the mask, wherein the second image of the grating pattern is a second line and space pattern having a plurality of lines between spaces;

measuring second critical dimensions of the second line and space pattern by measuring a second line width of lines of the second line and space pattern at a plurality of second positions, the second positions corresponding to the plurality of first positions;

estimating an influence of a pattern density of the mask upon critical dimension variations by comparing the first critical dimensions and the second critical dimensions;

calculating the critical dimension variations based on a model function representing a distribution of primary factors causing the critical dimension variations and design data;

determining whether the critical dimension variations are within a permissible value;

calculating a correcting bias added to the design data to reduce the critical dimension variations; and correcting the design data by using the correcting bias.

8. A method for manufacturing a semiconductor device comprising:

projecting, onto an identical exposure field on each of a plurality of test wafers under different lithography conditions, respectively, images of a mask, the mask including:

a grating pattern; and a test pattern having an opening;

wherein a first image of the grating pattern is a first line and space pattern having a plurality of lines between spaces, and an image of the opening in the projected image of the test pattern overlaps with a part of the first line and space pattern so that the image of the opening is surrounded by the first line and space pattern;

measuring first critical dimensions of the first line and space pattern formed under each of the lithography conditions respectively by measuring a first line width of lines of the first line and space pattern at a plurality of first positions around the image of the opening, the first positions being assigned from an edge of the image of the opening to a surrounding area of the image of the opening in the exposure field and having different distances from the edge;

projecting, onto a reference wafer, a second image of the grating pattern of the mask, wherein the second image of the grating pattern is a second line and space pattern having a plurality of lines between spaces;

measuring second critical dimensions of the second line and space pattern by measuring a second line width of lines of the second line and space pattern at a plurality of second positions, the second positions corresponding to the first positions;

estimating an influence of a pattern density of the mask upon critical dimension variations by comparing the first critical dimensions and the second critical dimensions;

determining a best lithography condition for reducing the critical dimension variations from the lithography conditions; and projecting a mask pattern onto a wafer to be manufactured under the best lithography condition to produce a device pattern on the wafer.

9. The method of claim 8, wherein the lithography conditions are different in an exposure tool used in a projection.

10. The method of claim 8, wherein the lithography conditions are different in a resist coated on the test wafers.

11. The method of claim 8, wherein the lithography conditions are different in a baking condition of a resist coated on the test wafers.

12. The method of claim 8, wherein the lithography conditions are different in a developing condition of a resist coated on the test wafers.

13. The method of claim 1, wherein the grating pattern is projected onto an entire area of the identical exposure field on the test wafer.

14. The method of claim 1, wherein the first positions of the lines are assigned to be gradually apart from the edge of the image of the opening of the test pattern to the surrounding area of the edge.

15. The method of claim 1, wherein the first positions of the lines are assigned along two directions passing through a center of the image of the opening of the test pattern.

* * * * *